US012787755B2

(12) United States Patent
Choi et al.

(10) Patent No.: US 12,787,755 B2
(45) Date of Patent: Nov. 3, 2026

(54) SEMICONDUCTOR DEVICES HAVING CONNECTING CONDUCTIVE LINES

(71) Applicant: Samsung Electronics Co., Ltd., Suwon-si (KR)

(72) Inventors: Hyungeun Choi, Suwon-si (KR); Jinwoo Han, Suwon-si (KR); Seokhan Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 244 days.

(21) Appl. No.: 18/675,252

(22) Filed: May 28, 2024

(65) Prior Publication Data

US 2025/0157925 A1 May 15, 2025

(30) Foreign Application Priority Data

Nov. 9, 2023 (KR) ........................ 10-2023-0154436

(51) Int. Cl.
*H10W 20/41* (2026.01)
*H10B 12/00* (2023.01)

(52) U.S. Cl.
CPC ........ *H10W 20/435* (2026.01); *H10B 12/315* (2023.02)

(58) Field of Classification Search
CPC ........ H10B 41/50; H10B 43/50; H10B 41/20; H10B 41/27; H10B 43/20; H10B 43/27; H10B 12/315; H10B 12/488; H10B 12/05; H10B 12/482; H10B 12/50; H10D 88/00; H10D 88/01; H10W 20/435
See application file for complete search history.

(56) References Cited

U.S. PATENT DOCUMENTS

| | | | | |
|---|---|---|---|---|
| 8,107,289 B2 * | 1/2012 | Shim | G11C 5/02 365/185.24 |
| 8,659,070 B2 * | 2/2014 | Tanaka | H10B 41/20 257/324 |
| 2014/0085961 A1 | 3/2014 | Kanamori et al. | |
| 2017/0338244 A1 | 11/2017 | Kito et al. | |

(Continued)

FOREIGN PATENT DOCUMENTS

| | | |
|---|---|---|
| KR | 10-2013-0042302 A | 4/2013 |
| KR | 10-2014-0043262 A | 4/2014 |

(Continued)

*Primary Examiner* — Sonya McCall-Shepard
(74) *Attorney, Agent, or Firm* — Muir Patent Law, PLLC

(57) ABSTRACT

A semiconductor device includes: a substrate including a memory cell region and a contact region; active layers extending in a first horizontal direction and stacked to be spaced apart from each other in a vertical direction on the memory cell region; gate electrodes disposed between the active layers, extending in a second horizontal direction, and stacked to be spaced apart from each other in the vertical direction; connecting conductive lines extending in the first horizontal direction and stacked to be spaced apart from each other in the vertical direction, on the contact region; and vertical conductive patterns extending in the vertical direction and in contact with the active layers, on the memory cell region. Each of the connecting conductive lines are disposed on the same level, among the gate electrodes, and are in contact with the gate electrodes spaced apart from each other in the first horizontal direction.

20 Claims, 27 Drawing Sheets

(56) References Cited

U.S. PATENT DOCUMENTS

| | | | | |
|---|---|---|---|---|
| 2019/0130974 | A1 | 5/2019 | Kim et al. | |
| 2019/0157297 | A1 | 5/2019 | Kim et al. | |
| 2019/0206869 | A1* | 7/2019 | Kim | H10B 12/20 |
| 2019/0252386 | A1* | 8/2019 | Lee | H10B 12/30 |
| 2019/0355738 | A1 | 11/2019 | Zhao et al. | |
| 2020/0006434 | A1* | 1/2020 | Kim | H10B 61/10 |
| 2021/0125989 | A1* | 4/2021 | Shin | H10B 12/02 |
| 2022/0173106 | A1 | 6/2022 | Choi et al. | |
| 2023/0180455 | A1 | 6/2023 | Choi et al. | |
| 2023/0309289 | A1 | 9/2023 | Choi et al. | |
| 2023/0397400 | A1* | 12/2023 | Tang | H10B 12/05 |
| 2024/0119978 | A1 | 4/2024 | Han et al. | |

FOREIGN PATENT DOCUMENTS

| | | | |
|---|---|---|---|
| KR | 10-2018-0073045 | A | 7/2018 |
| KR | 10-2019-0046490 | A | 5/2019 |
| KR | 10-2023-0082919 | A | 6/2023 |
| TW | 202224146 | A | 6/2022 |

* cited by examiner

SEMICONDUCTOR DEVICES HAVING CONNECTING CONDUCTIVE LINES

CROSS-REFERENCE TO RELATED APPLICATION(S)

This application claims benefit of priority under 35 U.S.C. § 119 to Korean Patent Application No. 10-2023-0154436, filed on Nov. 9, 2023, in the Korean Intellectual Property Office, the disclosure of which is incorporated herein by reference in its entirety.

BACKGROUND

The present disclosure relates to semiconductor devices having connecting conductive lines.

With an increase in demand for high performance, high speed, and/or multifunctionalization of semiconductor devices, the degree of integration of semiconductor devices is increasing. In manufacturing a fine-patterned semiconductor device corresponding to the tendency of high integration of semiconductor devices, it is necessary to implement patterns having a fine width or a fine separation distance.

SUMMARY

An aspect of the present disclosure is to provide semiconductor devices having connecting conductive lines.

According to an aspect of the present disclosure, a semiconductor device, may include: a substrate including a memory cell region and a contact region; active layers extending in a first horizontal direction and stacked to be spaced apart from each other in a vertical direction on the memory cell region; gate electrodes disposed between the active layers, extending in a second horizontal direction, intersecting the first horizontal direction, and stacked to be spaced apart from each other in the vertical direction; connecting conductive lines disposed on the contact region, extending in the first horizontal direction, and stacked to be spaced apart from each other in the vertical direction; and vertical conductive patterns disposed on the memory cell region, extending in the vertical direction, and in contact with the active layers. Each of the connecting conductive contacts one gate electrode of the gate electrodes that are spaced apart from each other in the first horizontal direction and are disposed at the same level.

According to an aspect of the present disclosure, a semiconductor device may include: a substrate including a memory cell region and a contact region; a stack structure disposed on the memory cell region, the stack structure including memory cell blocks spaced apart from each other in a first horizontal direction; a connection structure including connecting conductive lines disposed on the contact region, extending in the first horizontal direction, and stacked to be spaced apart from each other in a vertical direction; and contact plugs penetrating through the connection structure in the vertical direction. Each of the memory cell blocks may include: active layers extending in the first horizontal direction and stacked to be spaced apart from each other in the vertical direction; gate electrodes disposed between the active layers, extending in a second horizontal direction, intersecting the first horizontal direction, and stacked to be spaced apart from each other in the vertical direction; and vertical conductive patterns extending in the vertical direction and in contact with the active layers. Each of the connecting conductive lines is in contact with one gate electrode of the gate electrodes of the memory cell blocks.

According to an aspect of the present disclosure, a semiconductor device may include: a substrate including a memory cell region and a contact region; a stack structure disposed on the memory cell region, the stack structure including memory cell blocks spaced apart from each other in a first horizontal direction; a connection structure including connecting conductive lines disposed on the contact region, extending in the first horizontal direction, and stacked to be spaced apart from each other in a vertical direction; and contact plugs penetrating through the connection structure in the vertical direction. Each of the memory cell blocks may include: active layers extending in the first horizontal direction and stacked to be spaced apart from each other in the vertical direction, each active layer including a channel region and a first impurity region and a second impurity region spaced apart from each other in the first horizontal direction with the channel region interposed therebetween; gate electrodes overlapping the channel regions of the active layers, extending in a second horizontal direction, intersecting the first horizontal direction, and stacked to be spaced apart from each other in the vertical direction; vertical conductive patterns extending in the vertical direction and in contact with the first impurity regions of the active layers; and a capacitor structure in contact with the second impurity regions of the active layers. Each of the contact plugs is electrically connected to a corresponding gate electrode among the gate electrodes, and each of the connecting conductive lines contacts one gate electrode of the gate electrodes that are spaced apart from each other in the first horizontal direction and are disposed at the same level.

According to embodiments of the technical concept of the present disclosure, a connecting conductive line may intersect gate electrodes and may be in contact with the gate electrodes. A through-plug may extend in a vertical direction and may penetrate through connecting conductive lines, and may be connected to a corresponding connecting conductive line. Accordingly, a space in which the connecting conductive line and the contact plug are disposed may be reduced, thereby reducing a size of the semiconductor device.

Advantages and effects of the present application are not limited to the foregoing content and may be more easily understood in the process of describing a specific example embodiment of the present disclosure.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
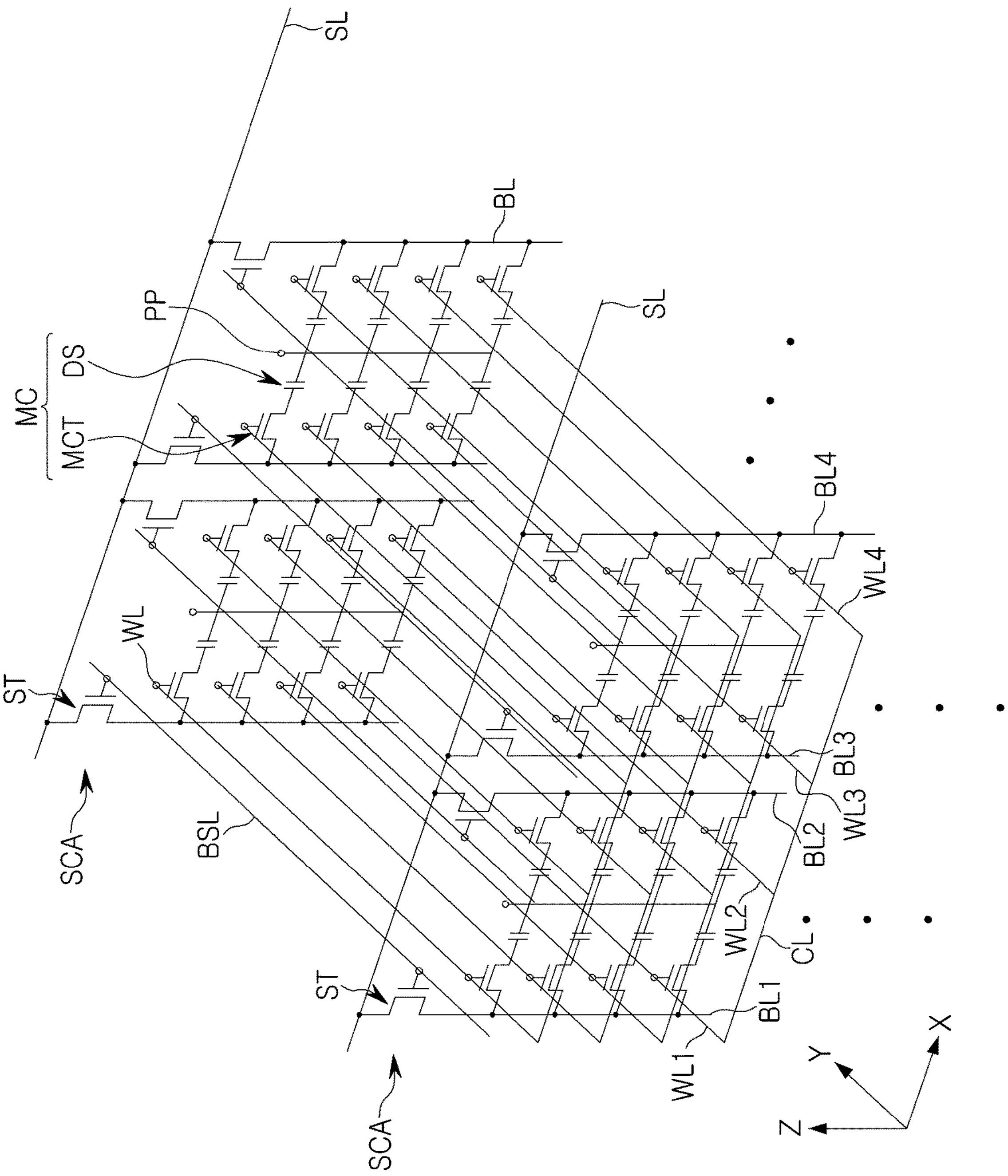
FIG. 1 is a schematic circuit diagram illustrating a memory cell array of a semiconductor device according to example embodiments.

Hereinafter, example embodiments of the present disclosure will be described with reference to the accompanying drawings. Like reference characters refer to like elements throughout.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer, or section, for example as a naming convention. Thus, a first element, component, region, layer, or section discussed below in one section of the specification could be termed a second element, component, region, layer, or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

FIG. 1 is a schematic circuit diagram illustrating a memory cell array of a semiconductor device according to example embodiments.

Referring to FIG. 1, a memory cell array of a semiconductor device according to example embodiments may include a plurality of sub-cell arrays SCA. The plurality of sub-cell arrays SCA may be arranged in a Y-direction. Each of the plurality of sub-cell arrays SCA may include a plurality of bit lines BL, a plurality of word lines WL, a plurality of connection lines CL, a plurality of select transistors ST, a plurality of select lines BSL, a plurality of strapping lines SL, a plurality of memory cells MC, and a plurality of plate electrodes PP. The memory cell MC may include a memory cell transistor MCT and an information storage element DS. One memory cell MC may be disposed between one word line WL and one bit line BL. A cell array of the semiconductor device may correspond to a memory cell array of a dynamic random access memory (DRAM) device.

The word lines WL may extend lengthwise in the Y-direction. The word lines WL within one sub-cell array SCA may be spaced apart from each other in an X-direction and a Z-direction. For example, the word lines WL may include first to fourth word lines WL1, WL2, WL3, and WL4 spaced apart from each other in the X-direction. The first to fourth word lines WL1, WL2, WL3, and WL4 are disposed at the same level and may be connected to different memory cells MC.

The connection lines CL may be spaced apart from each other in the Z-direction and may connect the word lines WL disposed at the same level. For example, the first to fourth word lines WL1, WL2, WL3, and WL4 may be connected to each other by one of the connection lines CL.

The bit lines BL may extend lengthwise in the Z-direction. The bit lines BL within one sub-cell array SCA may be spaced apart from each other in the X-direction. For example, within one sub-cell array SCA, the bit lines BL may include first to fourth bit lines BL1, BL2, BL3, and BL4 spaced apart from each other in the X-direction.

The strapping lines SL may be connected to the bit lines BL within one sub-cell array SCA. For example, select transistors ST may be disposed between the strapping line SL and the bit lines BL. Each select transistors ST may include a gate, a source, and a drain. The gate may be connected to a select line BSL, and one of the source and drain may be connected to the bit lines BL and the other may be connected to the strapping lines SL.

The select lines BSL may extend lengthwise in the Y-direction and may be configured to control on/off operations of the select transistors ST of the sub-cell arrays SCA. One of the bit lines BL may be selected by the on/off operation of the select transistors ST and electrically connected to the strapping line SL. During read and write operations of the memory cells MC, a selected one of the bit lines BL may be electrically connected to the strapping line SL, and thus, capacitance of the strapping line SL may be reduced. Accordingly, an RC delay may be reduced and a decrease in operation speed of the semiconductor device may be prevented.

The word lines WL, the bit lines BL, the connection lines CL, and the strapping lines SL are each disposed on a substrate 101 (see FIG. 5), and may be conductive patterns (e.g., metal lines) extending in one direction.

The memory cell transistor MCT may include a gate, a source, and a drain. The gate may be connected to the word line WL, the source may be connected to the bit line BL, and the drain may be connected to an information storage element DS. The information storage element DS may include a capacitor comprised of lower and upper electrodes and a dielectric layer.

The plate electrodes PP may extend in the Z-direction and may be electrically connected to the information storage elements DS. The plate electrodes PP may be disposed between adjacent memory cells MC in the X-direction.

Furthermore, the semiconductor device may further include contact plugs 180 (see FIG. 2) electrically connected to the connection lines CL. Each of the contact plugs 180 may be electrically connected to a corresponding one of the connection lines CL. Accordingly, even if the word lines WL are electrically connected to each other through the connection line CL, random access to the memory cells MC may be possible using the contact plugs 180 and the select transistors ST.

According to an example embodiment of the present disclosure, the circuit diagram of FIG. 1 may be implemented with, for example, a semiconductor device described in FIGS. 2 to 6B below.

Figure 2:
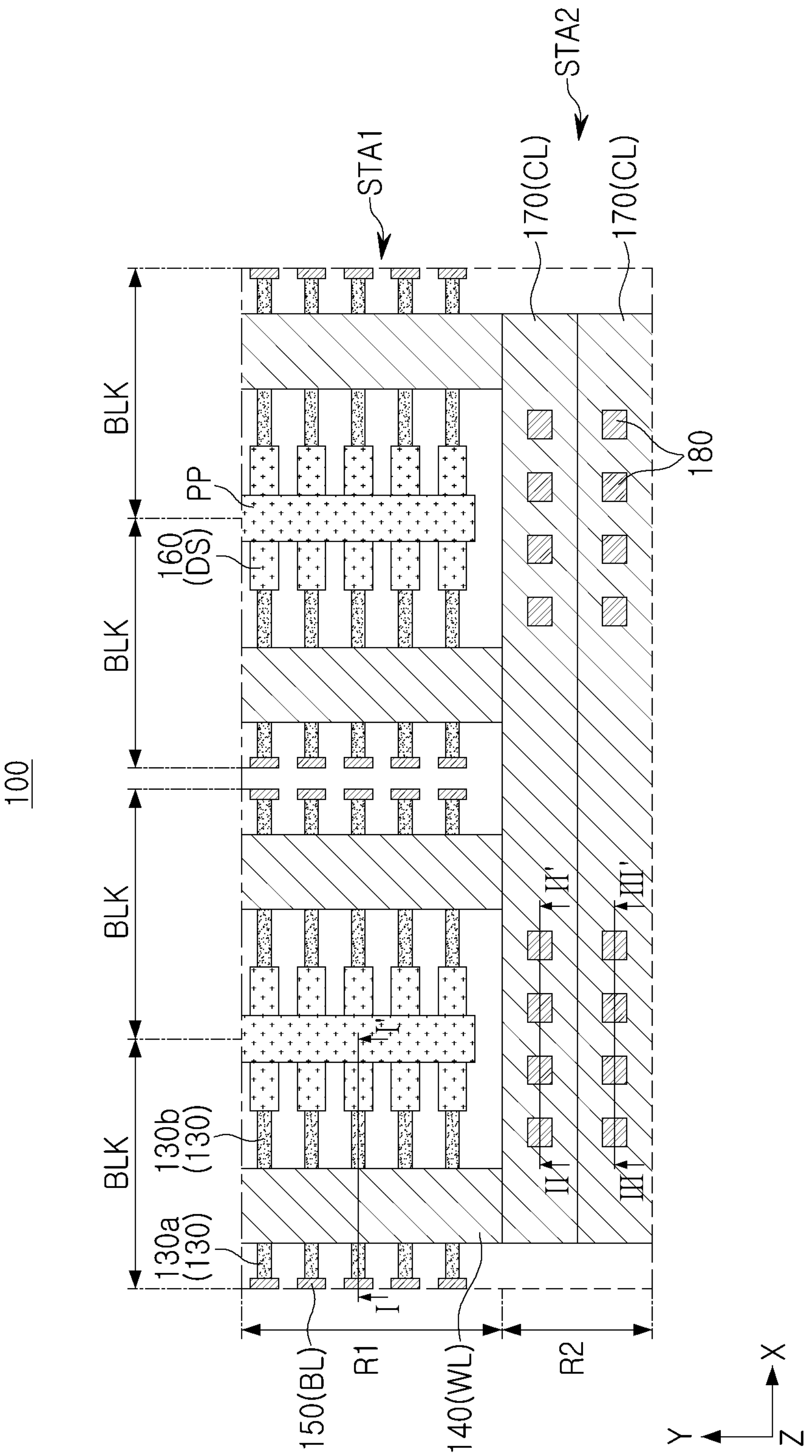
FIG. 2 is a schematic plan view illustrating a semiconductor device according to an example embodiment.
Figure 3:
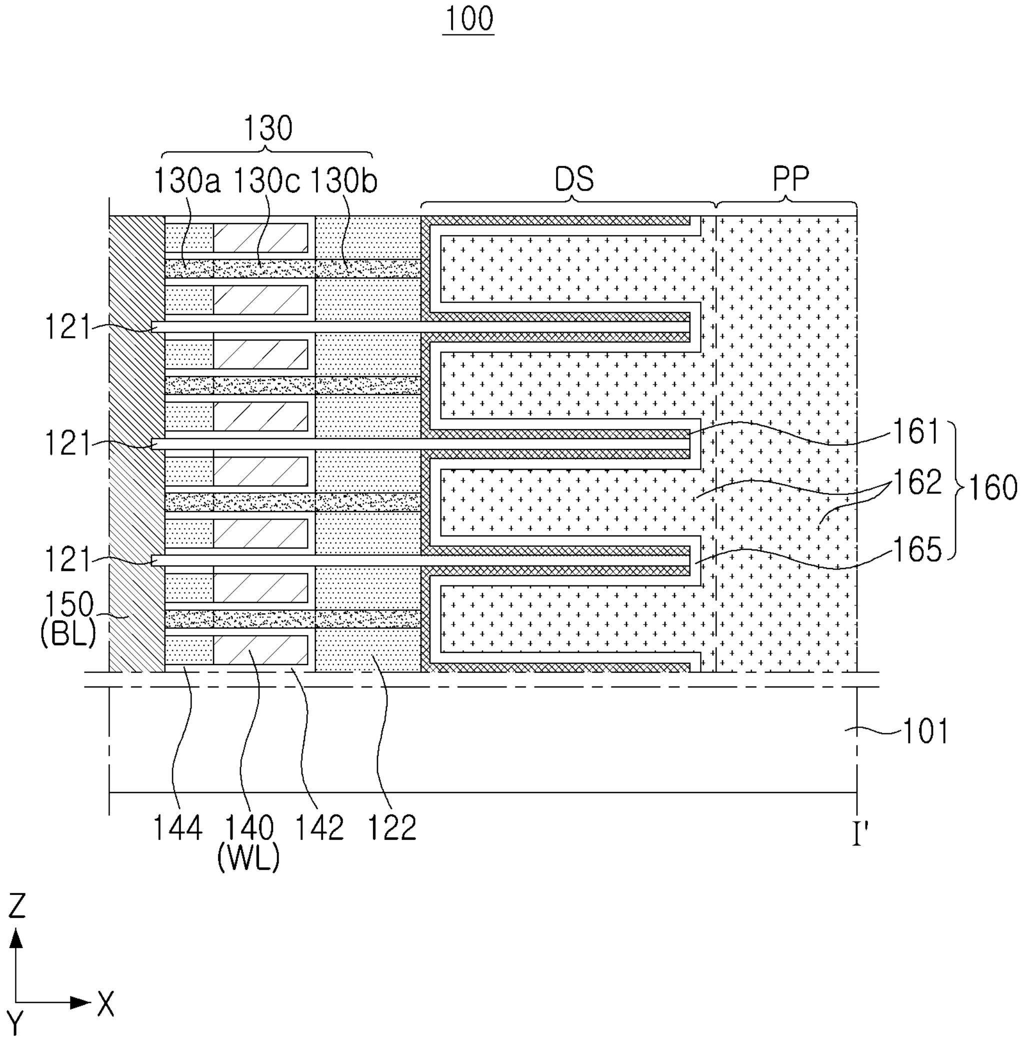
FIG. 3 is a vertical cross-sectional view taken along line I-I' of the semiconductor device illustrated in FIG. 2.
Figure 4:
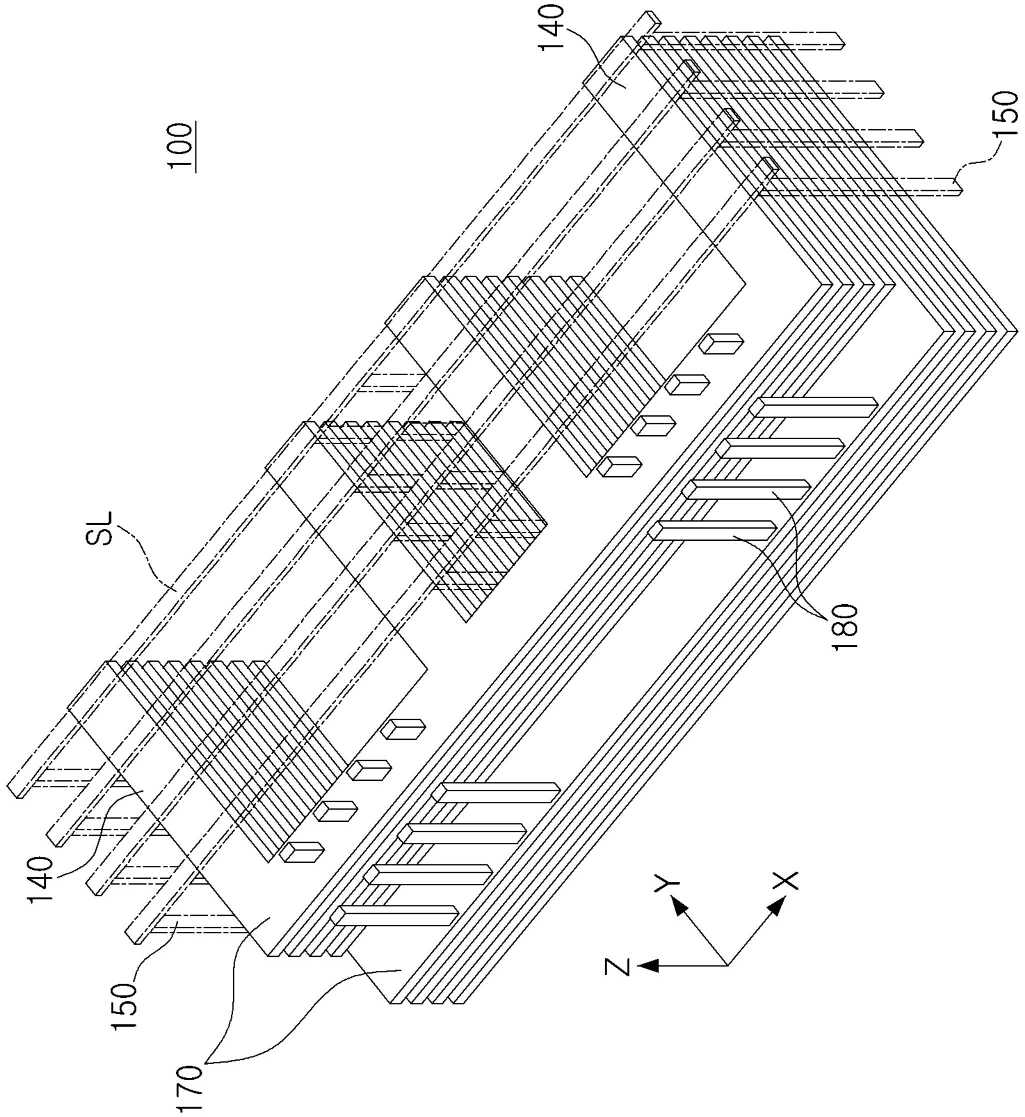
FIGS. 4 and 5 are schematic perspective views illustrating a semiconductor device according to an example embodiment.
Figure 5:
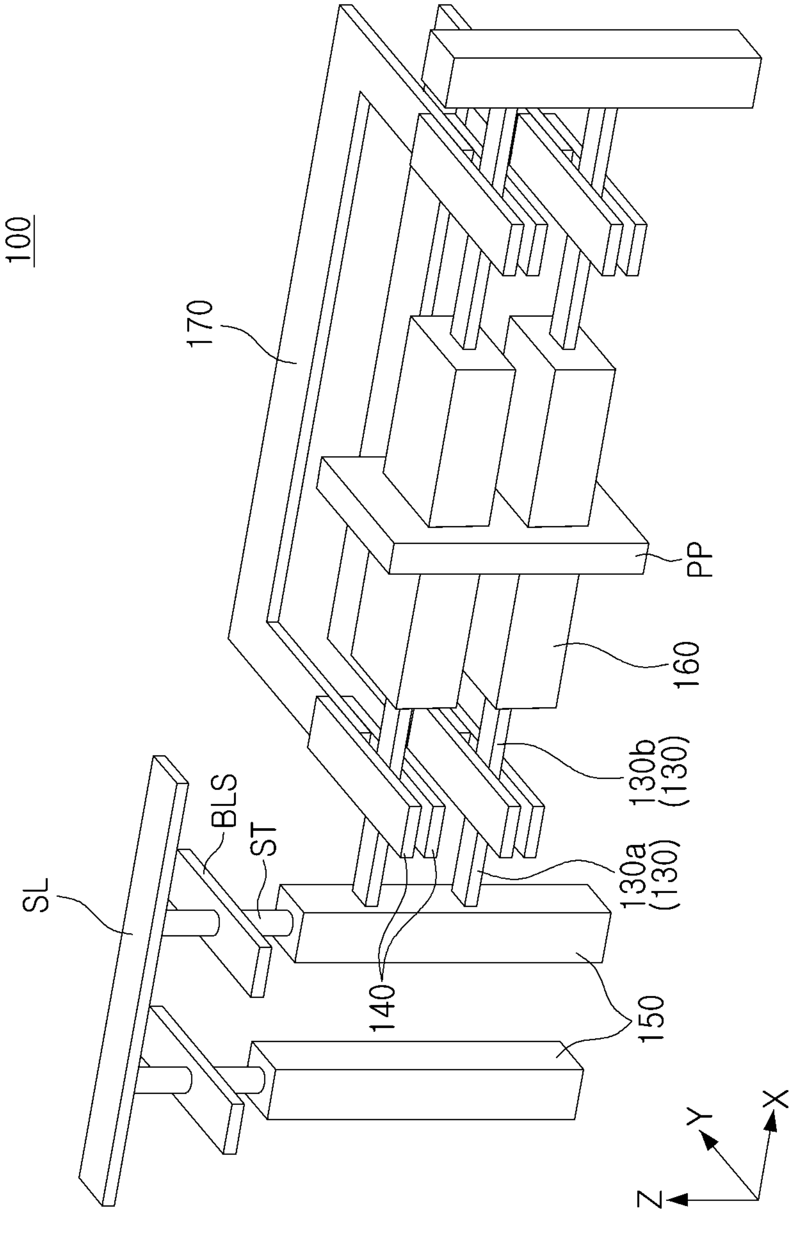

FIG. 2 is a schematic plan view of a semiconductor device according to example embodiments. FIG. 2 exemplarily illustrates a structure of the sub-cell array described with reference to FIG. 1. FIG. 3 is a vertical cross-sectional view taken along line I-I' of the semiconductor device illustrated in FIG. 2. FIGS. 4 and 5 are schematic perspective views illustrating semiconductor devices according to example embodiments. FIG. 4 schematically illustrates a connection structure of word lines WL, bit lines BL, and connection lines CL. FIG. 5 schematically illustrates a connection structure of word lines WL, bit lines BL, connection lines CL, select transistors ST, strapping lines SL, memory cells MC, and plate electrodes PP.

Referring to FIGS. 2 to 5, a substrate 101 of a semiconductor device 100 may include a memory cell region R1 and a contact region R2. The memory cell region R1 may be adjacent to the contact region R2 in a Y-direction, although embodiments are not limited thereto.

The semiconductor device 100 may include active layers 130, gate electrodes 140, vertical conductive patterns 150 extending lengthwise in the Z-direction, and a capacitor structure 160, disposed on the substrate 101 in the memory cell region R1. The semiconductor device 100 may include connecting conductive lines 170 and contact plugs 180 disposed on a contact region R2.

The semiconductor device 100 may include, for example, a DRAM cell array. The vertical conductive patterns 150 may correspond to the bit lines BL in FIG. 1, at least one of the gate electrodes 140 may correspond to the word line WL of FIG. 1, and the capacitor structure 160 may correspond to the information storage element DS and the plate electrode PP of FIG. 1.

The substrate 101 may include a memory cell region R1 and a contact region R2. The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may further include impurities. The substrate 101 may be a silicon substrate, a silicon-on-insulator (SOI) substrate, a germanium substrate, a germanium-on-insulator (GOI) substrate, a silicon-germanium substrate, or an epitaxial layer.

The active layers 130 are disposed on the substrate 101 and may horizontally extend in the X-direction. The active layers 130 may be spaced apart from each other in the Y-direction and the Z-direction. In a plan view, the active layers 130 may have a linear shape, a bar shape, or a pillar shape, intersecting the gate electrodes 140 and extending in the X-direction. In an example, the active layers 130 may be formed of or include a semiconductor material, for example, silicon, germanium, or silicon-germanium.

Each of the active layers 130 may include a first impurity region 130*a*, a second impurity region 130*b*, and a channel region 130*c*. The channel region 130*c* may be disposed between the first impurity region 130*a* and the second impurity region 130*b*. The first impurity region 130*a* may be in contact with a vertical conductive pattern 150 and may be electrically connected to the vertical conductive pattern 150. The second impurity region 130*b* may be in contact with a first electrode 161 of the capacitor structure 160 and may be electrically connected to the first electrode 161. A length of the first impurity region 130*a* in the X-direction and a length of the second impurity region 130*b* in the X-direction may be different from each other, or may be identical to each other. The channel region 130*c* may overlap the gate electrodes 140 in the Z-direction. When the active layer 130 is formed of a semiconductor material, each of the first impurity region 130*a* and the second impurity region 130*b* may include impurities, and the impurities may have an N-type or P-type conductivity type.

At least a portion of the first impurity region 130*a* may correspond to a first source/drain region of the memory cell transistor MCT of FIG. 1, and at least a portion of the second impurity region 130*b* may correspond to a second source/drain region of the memory cell transistor MCT of FIG. 1. At least a portion of the channel region 130*c* may correspond to a channel of the memory cell transistor MCT of FIG. 1. The first impurity region 130*a* may provide a region for directly connecting the memory cell transistor MCT to the bit line BL, and the second impurity region 130*b* may provide a region for directly connecting the memory cell transistor MCT to the information storage element DS.

In another example, the active layers 130 may be formed of or include at least one of oxide semiconductors, such as a hafnium-silicon oxide (HSO), a hafnium-zinc oxide (HZO), an indium-zinc oxide (IZO), an indium-gallium oxide (IGO), an indium-tin oxide (ITO), an indium-gallium-zinc oxide (IGZO), and an indium-tin-zinc oxide (ITZO).

In another example, the active layers 130 may include a two-dimensional material in which atoms may form a predetermined crystal structure and form a channel of a transistor. The two-dimensional material layer may be formed of or include at least one of a transition metal dichalcogenide material layer (TMD material layer), a black phosphorous material layer, and a hexagonal boron-nitride material layer (hBN material layer). For example, the two-dimensional material layer may include at least one of BiOSe, Crl, WSe2, MoS2, TaS, WS, SnSe, ReS, B—SnTe, MnO, AsS, P (black), InSe, h-BN, GaSe, GaN, SrTiO, MXene, and Janus 2D materials, which may form a two-dimensional material.

In some example embodiments, the semiconductor device 100 may further include epitaxial layers respectively connected to the first impurity region 130*a* and the second impurity region 130*b* of the active layer 130 and grown from the active layer 130.

The first insulating layer 121 may be disposed between adjacent gate electrodes 140 in the Z-direction, and may extend in a horizontal direction. The first insulating layer 121 may further extend to an interface region. The first insulating layer 121 may be formed of or include at least one of silicon oxide, silicon nitride, silicon oxynitride, and silicon oxycarbide, and may be formed of or include, for example, silicon oxide.

The gate electrodes 140 may be disposed on the substrate 101 and may horizontally extend in the Y-direction. The gate electrodes 140 may be spaced apart from each other in the X-direction and the Z-direction. The gate electrodes 140 may be disposed between the channel regions 130*c* of the active layer 130. In a plan view, the gate electrodes 140 may have a line shape, a bar shape, or a pillar shape, intersecting the vertical conductive pattern 150 and extending in the Y-direction.

The gate electrodes 140 may be formed of or include a conductive material, and the conductive material may include at least one of a doped semiconductor material (e.g., doped silicon, doped germanium, or the like), a conductive metal nitride (e.g., titanium nitride, tantalum nitride, tungsten nitride, or the like), metal (e.g., tungsten, titanium, tantalum, cobalt, aluminum, ruthenium, or the like), and a metal-semiconductor compound (e.g., tungsten silicide, cobalt silicide, titanium silicide, or the like). At least one of the gate electrodes 140 may correspond to the word lines WL described with reference to FIG. 1. In an example embodiment, the gate electrodes 140 may be disposed on an upper surface and a lower surface of each active layer 130, and two gate electrodes 140 adjacent to each active layer 130 may form one word line WL. In some example embodiments, the memory cell transistor MCT may have a single gate structure. For example, one of the gate electrodes 140 may be disposed adjacent to each active layer 130, and one gate electrode 140 may form a word line WL. In some example embodiments, the gate electrode 140 may be disposed in a gate all around structure surrounding the active layer 130.

The semiconductor device 100 may further include first insulating layers 121 disposed between adjacent gate electrodes 140 and second insulating layers 122 disposed at the same level as the gate electrodes 140. The first insulating layers 121 may extend in the horizontal direction between adjacent gate electrodes 140. For example, the first insulating layers 121 may be in contact with the vertical conductive pattern 150 and the capacitor structure 160. For example, a first end of each first insulating layer 121 may contact the vertical conductive pattern 150 and a second end of the first insulating layer 121 opposite the first end may contact the capacitor structure 160. A portion of the first insulating layers 121 may be disposed between the first electrodes 161 of the capacitor structure 160. For example, the portion of the first insulating layers 121 may contact adjacent first electrodes 161 of the capacitor structure 160.

The second insulating layers 122 may be disposed between the gate electrodes 140 and the capacitor structure 160. The second insulating layers 122 may overlap the second impurity regions 130*b* of the active layers 130 in the Z-direction. The first insulating layers 121 and second insulating layers 122 may be formed of or include silicon oxide, silicon nitride, silicon oxynitride, or a combination thereof. For example, the first insulating layers 121 may be formed of or include silicon oxide, and the second insulating layers 122 may be formed of or include silicon nitride.

The semiconductor device 100 may further include a gate dielectric layer 142 surrounding the gate electrodes 140 and gate capping layers 144 disposed at the same level as the gate electrodes 140.

The gate dielectric layer 142 may cover an upper surface, a lower surface, and a side surface of each of the gate electrodes 140. The gate dielectric layer 142 may contact the upper surface, the lower surface, and the side surface of each of the gate electrodes 140. The gate dielectric layer 142 may be disposed between the gate electrode 140 and the active layer 130, between the gate electrode 140 and the second insulating layer 122, and between the gate capping layer 144 and the active layer 130. The gate dielectric layer 142 may contact the active layer 130 the second insulating layer 122. The gate dielectric layer 142 may be in contact with the vertical conductive pattern 150. The gate dielectric layer 142 may be formed of or include at least one of silicon oxide, silicon nitride, a low-K material, and a high-K material. The high-K material may refer to a dielectric material having a higher dielectric constant than silicon oxide, and the low-K material may refer to a dielectric material having a lower dielectric constant than silicon oxide. The high-K material may be, for example, a metal oxide or metal oxynitride. The high-K material may be, for example, one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide (ZrSixOy), hafnium oxide ($HfO_2$), hafnium silicon oxide (HfSixOy), lanthanum oxide ($La_2O_3$), lanthanum aluminum oxide (LaAlxOy), lanthanum hafnium oxide (LaHfxOy), hafnium aluminum oxide (HfAlxOy) or praseodymium oxide ($Pr_2O_3$). The gate dielectric layer 1142 may be formed from a single layer or multiple layers of the above-described materials.

The gate capping layers 144 may be disposed between the gate electrodes 140 and the vertical conductive pattern 150. The gate capping layers 144 may contact the gate electrodes 140 and the vertical conductive pattern 150. Upper and lower surfaces of the gate capping layers 144 may be covered with the gate dielectric layer 142. The gate dielectric layer 142 may contact the upper and lower surfaces of the gate capping layers 144. The gate capping layers 144 may be formed of or include a material different from that of the first insulating layers 121. The gate capping layers 144 may be formed of or include an insulating material, for example, at least one of silicon nitride, silicon oxynitride, and silicon oxycarbide. The gate capping layers 144 may overlap the first impurity regions 130*a* of the active layers 130 in the Z-direction.

The vertical conductive patterns 150 may extend vertically in the Z-direction on the substrate 101. The vertical conductive patterns 150 may be disposed to be spaced apart from each other in the X-direction and the Y-direction. A plurality of active layers 130 stacked in the Z-direction may be electrically connected to one vertical conductive pattern 150. For example, the vertical conductive pattern 150 may be electrically connected to the first impurity regions 130*a*. The vertical conductive patterns 150 may have a line shape, a bar a shape, or a column shape extending in the Z-direction. The vertical conductive patterns 150 may include at least one of a doped semiconductor material, a conductive metal nitride, a metal, and a metal-semiconductor compound. The vertical conductive patterns 150 may correspond to the bit line BL described with reference to FIG. 1.

The capacitor structure 160 may include a first electrode 161, a second electrode 162, and a capacitor dielectric 165 between the first and second electrodes 161 and 162. The capacitor dielectric 165 may contact the first and second electrodes 161 and 162. The capacitor structure 160 may provide a plurality of information storage elements DS and plate electrodes PP connected to the plurality of information storage elements DS. For example, the plurality of information storage elements DS may refer to a portion of the capacitor structure 160 extending in the X-direction. The plurality of information storage elements DS may be spaced apart from each other in the Y-direction and the Z-direction. The plate electrodes PP may extend in the Z-direction and be electrically connected to the information storage elements DS. For example, the plate electrodes PP may be comprised of the second electrode 162.

The capacitor structure 160 may be disposed adjacent to the second impurity region 130*b* of the active layer 130. The capacitor structure 160 may be electrically connected to the second impurity region 130*b* of the active layer 130. As illustrated in FIGS. 2 and 3, the first electrode 161 may have a cylinder shape, but is not limited thereto, and may have a pillar shape in some embodiments.

The first electrodes 161 may be in a state in which nodes are separated by first insulating layers 121. The first electrodes 161 may be referred to as 'storage node electrodes.' The first electrodes 161 may include at least one of a doped semiconductor material, a conductive metal nitride, a metal, and a metal-semiconductor compound.

The capacitor dielectric 165 may conformally cover the first electrode 161. For example, the capacitor dielectric 165 may contact the first electrode 161. The capacitor dielectric 165 may be formed of or include at least one of high-k materials such as zirconium oxide ($ZrO_2$), aluminum oxide ($Al_2O_3$), and hafnium oxide ($Hf_2O_3$).

The second electrode 162 may cover the capacitor dielectric 165 and may extend in the X-direction. For example, the second electrode 162 may contact the capacitor dielectric 165. At least a portion of the second electrode 162 may be referred to as a 'plate electrode (PP).' The second electrode 162 may include at least one of a doped semiconductor material, a conductive metal nitride, a metal, and a metal-semiconductor compound.

Components disposed on the substrate 101 in the memory cell region R1 may form a stack structure STA1. For example, the stack structure STA1 may include a first insulating layer 121, a second insulating layer 122, active layers 130, gate electrodes 140, gate dielectric layer 142, a gate capping layer 144, vertical conductive patterns 150, and a capacitor structure 160.

The connecting conductive lines 170 may be disposed on the substrate 101 and may extend to intersect the gate electrodes 140. For example, the connecting conductive lines 170 may be in contact with ends of the gate electrodes 140 and extend in the X-direction. The connecting conductive lines 170 may be disposed to be spaced apart from each other in the Z-direction. The gate electrodes 140 may be disposed between the channel regions 130*c* of the active layer 130. In a plan view, the connecting conductive lines 170 may have a line shape, a bar shape, or a pillar shape extending in the X-direction. The connecting conductive lines 170 may correspond to the connection lines CL described with reference to FIG. 1.

The connecting conductive lines 170 may electrically connect the gate electrodes 140 disposed at the same level. For example, as illustrated in FIG. 2, each connecting conductive line 170 may electrically connect four gate electrodes 140 disposed at the same level. However, the number of gate electrodes 140 electrically connected to the connecting conductive line 170 is illustrative and is not limited thereto.

The connecting conductive lines 170 may include the same material as the gate electrodes 140. In some example embodiments, the connecting conductive lines 170 may be formed integrally with the gate electrodes 140.

Figure 6A:
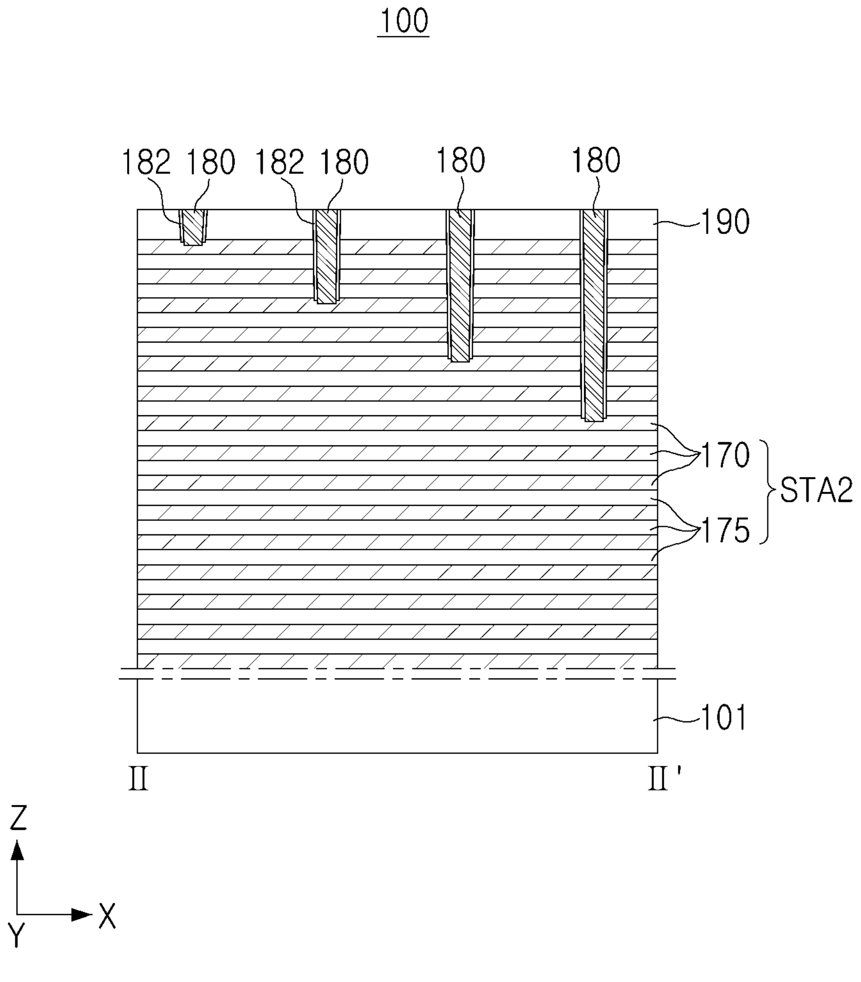
FIGS. 6A and 6B are vertical cross-sectional views taken along lines II-II' and III-III' of the semiconductor device illustrated in FIG. 2.
Figure 6B:
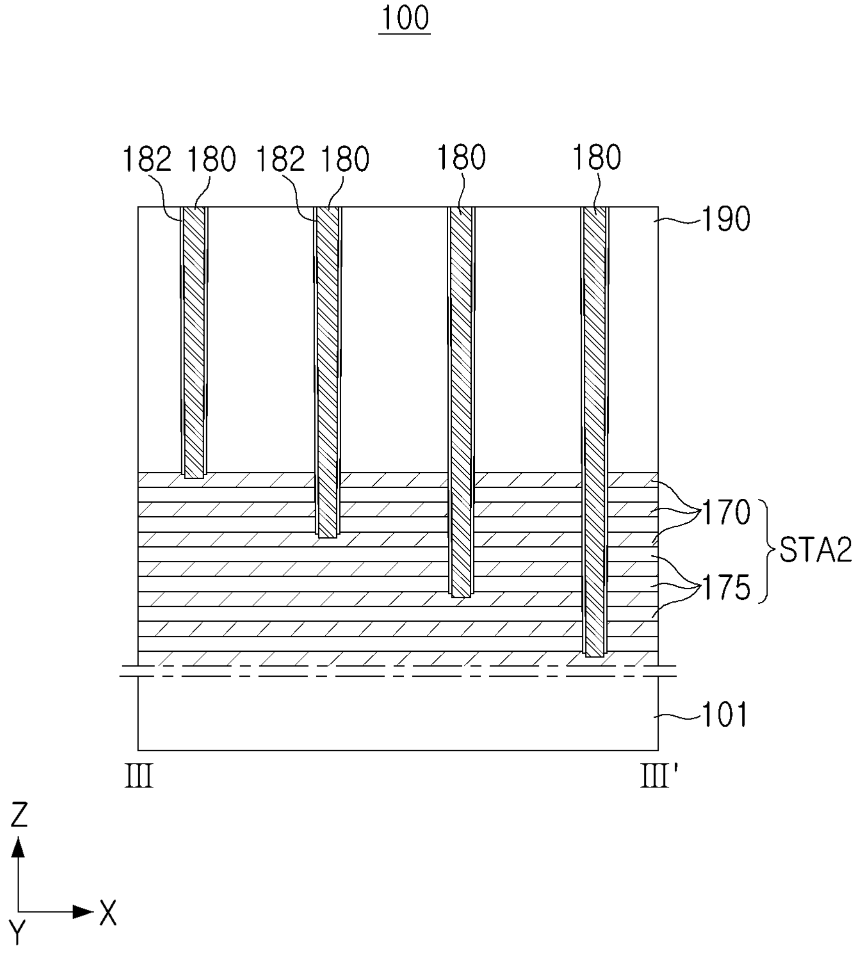

FIGS. 6A and 6B are vertical cross-sectional views taken along lines II-II' and III-III' of the semiconductor device illustrated in FIG. 2.

Referring further to FIGS. 6A and 6B, a semiconductor device 100 may further include pad insulating layers 175 and an interlayer insulating layer 190. The pad insulating layers 175 may be disposed between connecting conductive lines 170, and may be alternately stacked with the connecting conductive lines 170. The connecting conductive lines 170 and the pad insulating layers 175 may form a connection structure STA2. The interlayer insulating layer 190 may cover the connection structure STA2.

In an example embodiment, the connection structure STA2 may have a stepped structure. For example, the connection structure STA2 may be lowered in the Y-direction. A length of the connecting conductive lines 170 disposed in an upper portion of the connection structure STA2 in the Y-direction may be shorter than a length of the connecting conductive lines 170 disposed in a lower portion of the connection structure STA2 in the Y-direction.

The pad insulating layers 175 and the interlayer insulating layer 190 may include silicon oxide, silicon nitride, silicon oxynitride, or a combination thereof. For example, the pad insulating layers 175 and the interlayer insulating layer 190 may include silicon oxide.

The contact plugs 180 may extend in the Z-direction through the interlayer insulating layer 190, and may be electrically connected to the connection structure STA2. For example, at least one of the contact plugs 180 may extend in the Z-direction by penetrating through the connection structure STA2, and may be in contact with a corresponding connecting conductive line 170. In the top view, the contact plugs 180 are illustrated as having a rectangular shape, but the present disclosure is not limited thereto. In some example embodiments, the contact plugs 180 may have a circular or oval shape.

The semiconductor device 100 may further include plug insulating layers 182 covering side surfaces of the contact plugs 180. The plug insulating layers 182 may cover the side surfaces of the contact plugs 180 so that each contact plug 180 may be electrically connected to a corresponding connecting conductive line 170. For example, each contact plug 180 may be electrically connected to a connecting conductive line 170 in contact with a lower surface thereof. In an example embodiment, each contact plug 180 may extend further downward than plug insulating layers 182 corresponding thereto. For example, each contact plug 180 may have a plug insulating layer 182 surround and contacting side surfaces of the contact plug 180, and a portion of each contact plug 180 may extend beyond the plug insulating layer 182 to contact one of the connecting conductive lines 170.

As described above, according to example embodiments of the present disclosure, each contact plug 180 may extend in the Z-direction by penetrating through the connection structure STA2 and be in contact with the corresponding connecting conductive line 170. Accordingly, the contact plugs 180 may be implemented to have a small area of the connection structure STA2 as compared to a case in which one contact plug is disposed on one connecting conductive line when viewed in a plan view without penetrating through the connection structure STA2. Accordingly, the size of the semiconductor device 100 may be reduced.

The contact plugs 180 may include at least one of a doped semiconductor material, a conductive metal nitride, a metal, and a metal-semiconductor compound.

Referring again to FIG. 5, the semiconductor device 100 may further include a select transistor ST, a select line BSL, and a strapping line SL. The select transistor ST, the select line BSL, and the strapping line SL may correspond to the select transistor ST, select line BSL, and the strapping line SL described with reference to FIG. 1.

One end of the select transistor ST may be in contact with the vertical conductive pattern 150. For example, the select transistor ST may be disposed on the vertical conductive pattern 150 and extend in the Z-direction. In some example embodiments, the select transistor ST, the select line BSL, and the strapping line SL may be disposed below the vertical conductive pattern 150.

The select lines BSL may be disposed adjacently to the select transistors ST. For example, the select lines BSL may surround the select transistors ST, and the select transistors ST may penetrate through the select lines BSL in the Z-direction. The select lines BSL may extend lengthwise in the Y-direction.

The other end of the select transistor ST may be in contact with the strapping line SL. The strapping line SL may be electrically spaced apart from the vertical conductive patterns 150 spaced apart from each other in the X-direction through the select transistors ST. The strapping line SL may extend in the X-direction and may be electrically connected to a sense amplifier circuit.

The select line BSL may function as a gate of the select transistor ST, and a source and a drain of the select transistor ST may be connected to one of the vertical conductive pattern 150 and the strapping line SL, respectively. The select line BSL and the select transistor ST may operate to electrically connect one of the vertical conductive patterns 150 to the strapping line SL.

In an example embodiment, the select transistor ST may extend in the horizontal direction on the vertical conductive pattern 150. In an example embodiment, a plurality of select transistors ST may share one select line BSL. For example, the select line BSL may extend between the select transistors ST in the horizontal direction, or may surround the select transistors ST.

In an example embodiment, a peripheral circuit region in which a word line driver, a sense amplifier, row and column decoders, and control circuits are disposed may be spaced apart from the memory cell region R1 in the Z-direction, and the select line BSL and the strapping line SL may be disposed within the peripheral circuit region.

As illustrated in FIG. 2, the stack structure STA1 may include memory cell blocks BLK disposed in the memory cell region R1. The memory cell blocks BLK may extend in the Y-direction and may be spaced apart from each other in the X-direction. Each of the memory cell blocks BLK may include a first insulating layer 121, a second insulating layer 122, active layers 130, gate electrodes 140, a gate dielectric layer 142, a gate capping layer 144, vertical conductive patterns 150, and a capacitor structure 160. Adjacent memory cell blocks BLK are illustrated as sharing the plate electrode PP disposed therebetween, but the present disclosure is not limited thereto. The connecting conductive lines 170 of the present disclosure may be in contact with and be electrically connected to the gate electrodes 140 disposed in different memory cell blocks BLK.

Figure 7:
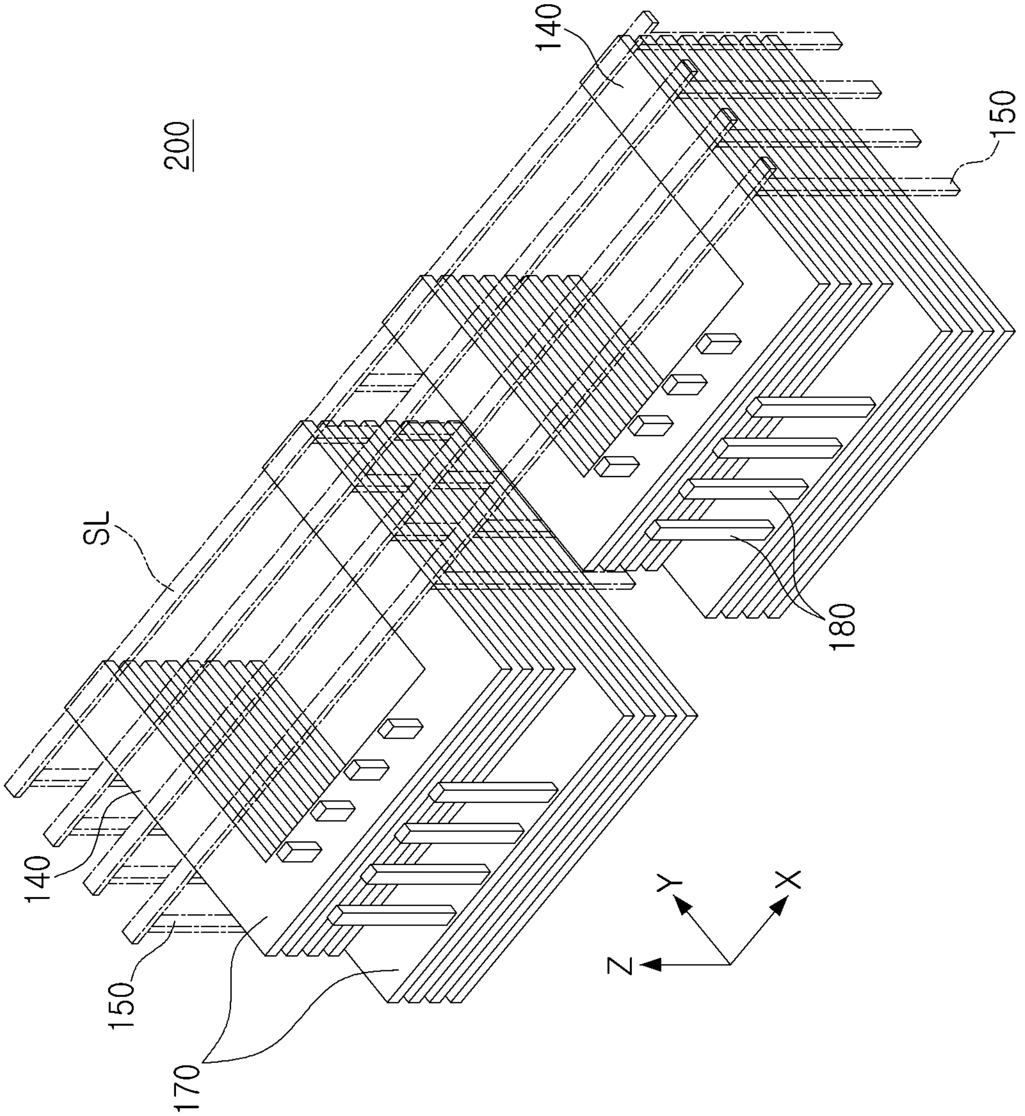
FIG. 7 is a schematic perspective view illustrating a semiconductor device according to an example embodiment.

FIG. 7 is a schematic perspective view illustrating a semiconductor device according to an example embodiment.

Referring to FIG. 7, a semiconductor device 200 may include connecting conductive lines 170 in contact with gate electrodes 140 spaced apart from each other in the X-direction. In an example embodiment, each of the connecting conductive lines 170 may be in contact with a pair of gate electrodes 140 spaced apart from each other in the X-direction. However, the number of gate electrodes 140 in contact with each connecting conductive line 170 is not limited thereto.

Figure 8:
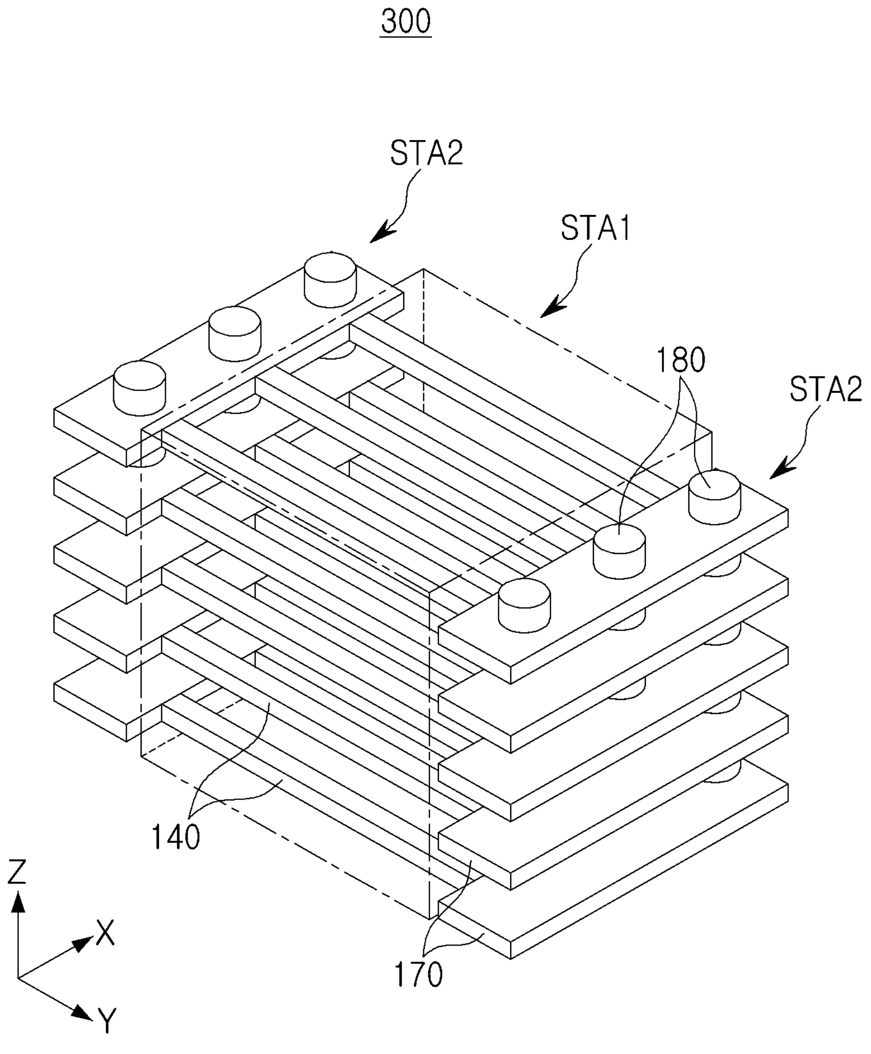
FIGS. 8 to 10 are schematic perspective views illustrating a semiconductor device according to example embodiments.
Figure 9:
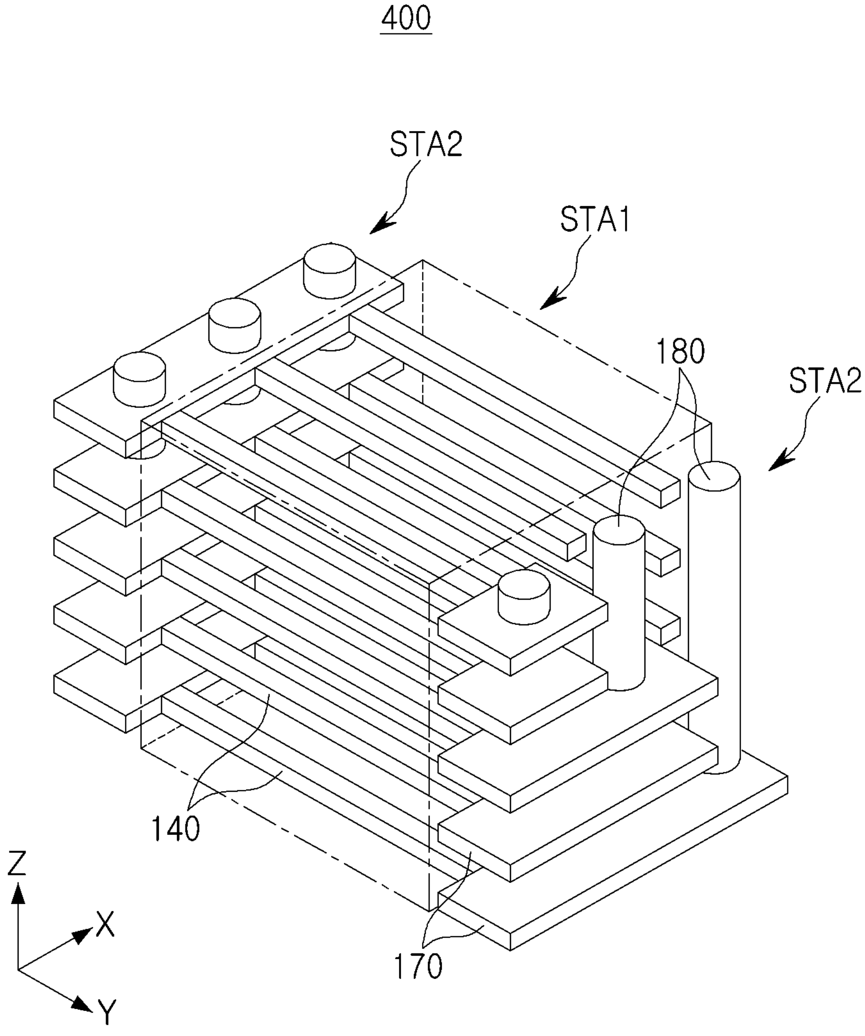
Figure 10:
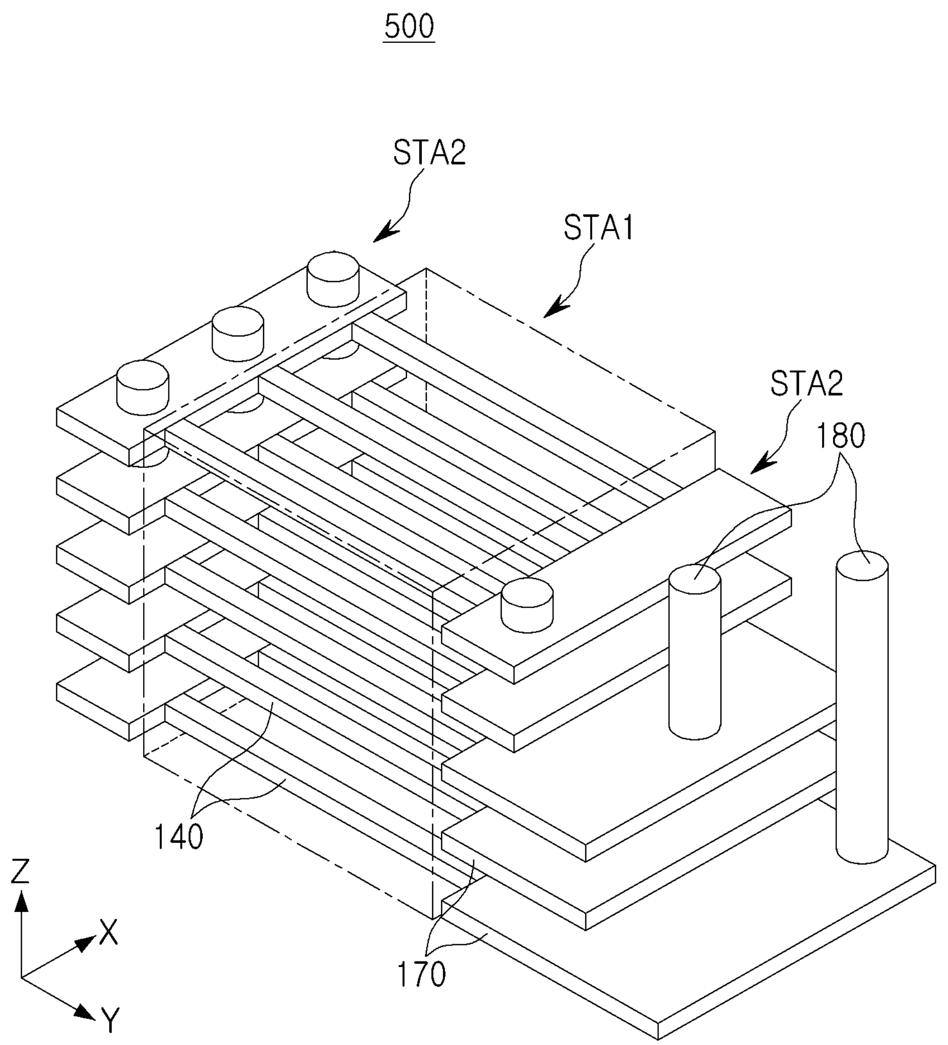

FIGS. 8 to 10 are schematic perspective views illustrating a semiconductor device according to example embodiments.

Referring to FIG. 8, the semiconductor device 300 may include a stack structure STA1 including gate electrodes 140, a connection structure STA2 including the connecting conductive lines 170, and contact plugs 180 vertically penetrating through the connection structure STA2 and coming into contact with the connecting conductive lines 170. In an example embodiment, the connection structure STA2 may not have a stepped structure. For example, lengths of each connecting conductive line 170 in the X-direction and lengths thereof in the Y-direction may be identical to each other. At least one of the contact plugs 180 may vertically penetrate through at least one of the connecting conductive lines 170. The contact plugs 180 may be spaced apart from each other in the X-direction.

Referring to FIG. 9, a semiconductor device 400 may include a stack structure STA1 including gate electrodes 140, a connection structure STA2 including connecting conductive lines 170, and contact plugs 180 vertically penetrating through the connection structure STA2 and coming into contact with the connecting conductive lines 170. In an example embodiment, the connection structure STA2 may have a stepped structure. For example, the connection structure STA2 may be shortened in the X-direction. The connecting conductive lines 170 may include a first connecting conductive line 170 and a second connecting conductive line 170, and a first length of the first connecting conductive line 170 in the X-direction may be different from a second length of the second connecting conductive line 170 in the X-direction.

The contact plugs 180 may not penetrate through the connecting conductive lines 170 vertically. For example, the contact plugs 180 may vertically penetrate through the pad insulating layers 175 of the connection structure STA2 illustrated in FIGS. 6A and 6B, and may be in contact with upper surfaces of corresponding connecting conductive lines 170. The contact plugs 180 may be spaced apart from each other in the X-direction.

Referring to FIG. 10, a semiconductor device 500 may include a stack structure STA1 including gate electrodes 140, a connection structure STA2 including connecting conductive lines 170, and contact plugs 180 vertically penetrating through the connection structure STA2 and coming into contact with the connecting conductive lines 170. In an example embodiment, the connection structure STA2 may have a stepped structure. For example, the connection structure STA2 may be shortened in the Y-direction. The connecting conductive lines 170 may include a first connecting conductive line 170 and a second connecting conductive line 170, and a first length of the first connecting conductive line 170 in the Y-direction may be different from a second length of the second connecting conductive line 170 in the Y-direction.

The contact plugs 180 may not penetrate through the connecting conductive lines 170 vertically. For example, each contact plug 180 may contact an upper surface of a corresponding one of the connecting conductive lines 170. The contact plugs 180 may be spaced apart from each other in the X-direction and the Y-direction.

Figure 11:
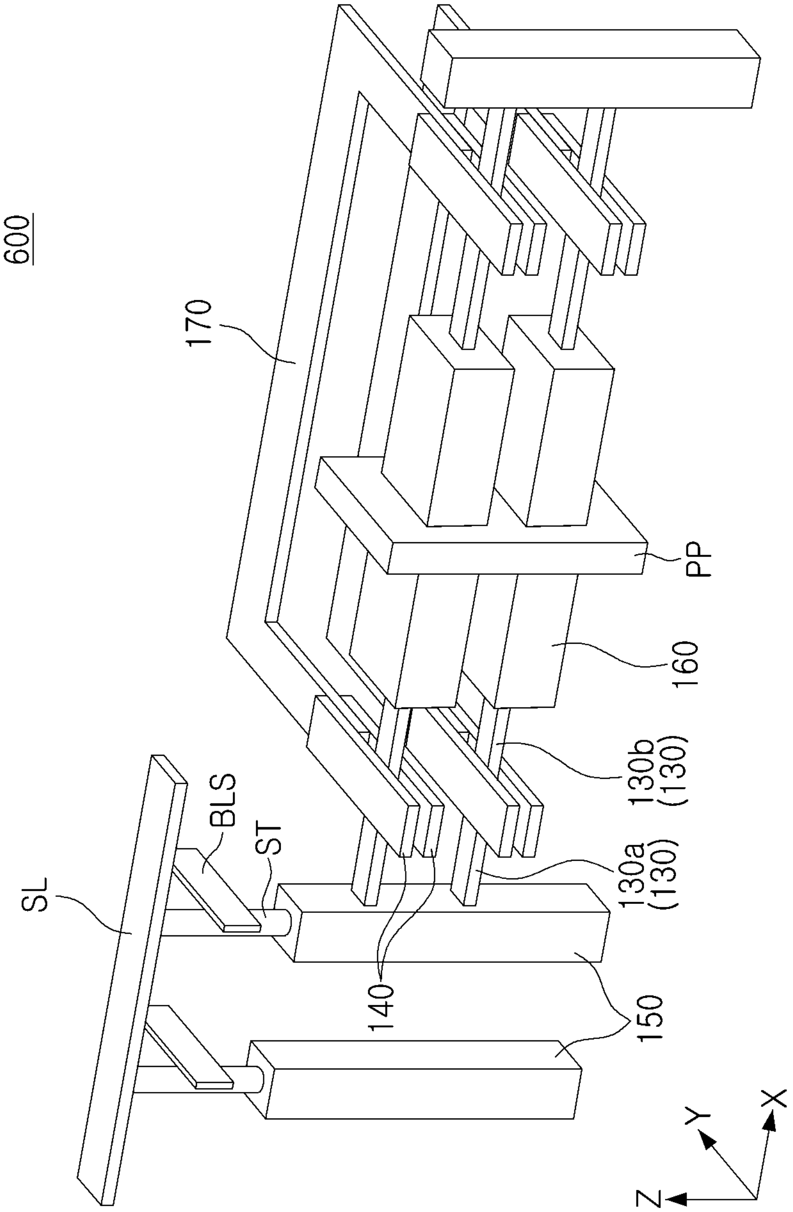
FIG. 11 is a schematic perspective view illustrating a semiconductor device according to an example embodiment.

Referring to FIG. 11, a semiconductor device 600 may include a select transistor ST and a strapping line SL connected to a vertical conductive pattern 150. In an example embodiment, a select line BSL may be disposed adjacent to the select transistor ST. For example, the select line BSL may be disposed on a side surface of the select transistor ST and may extend in the Y-direction. In example embodiments, the select line BSL may contact the side surface of the select transistor ST.

Figure 12:
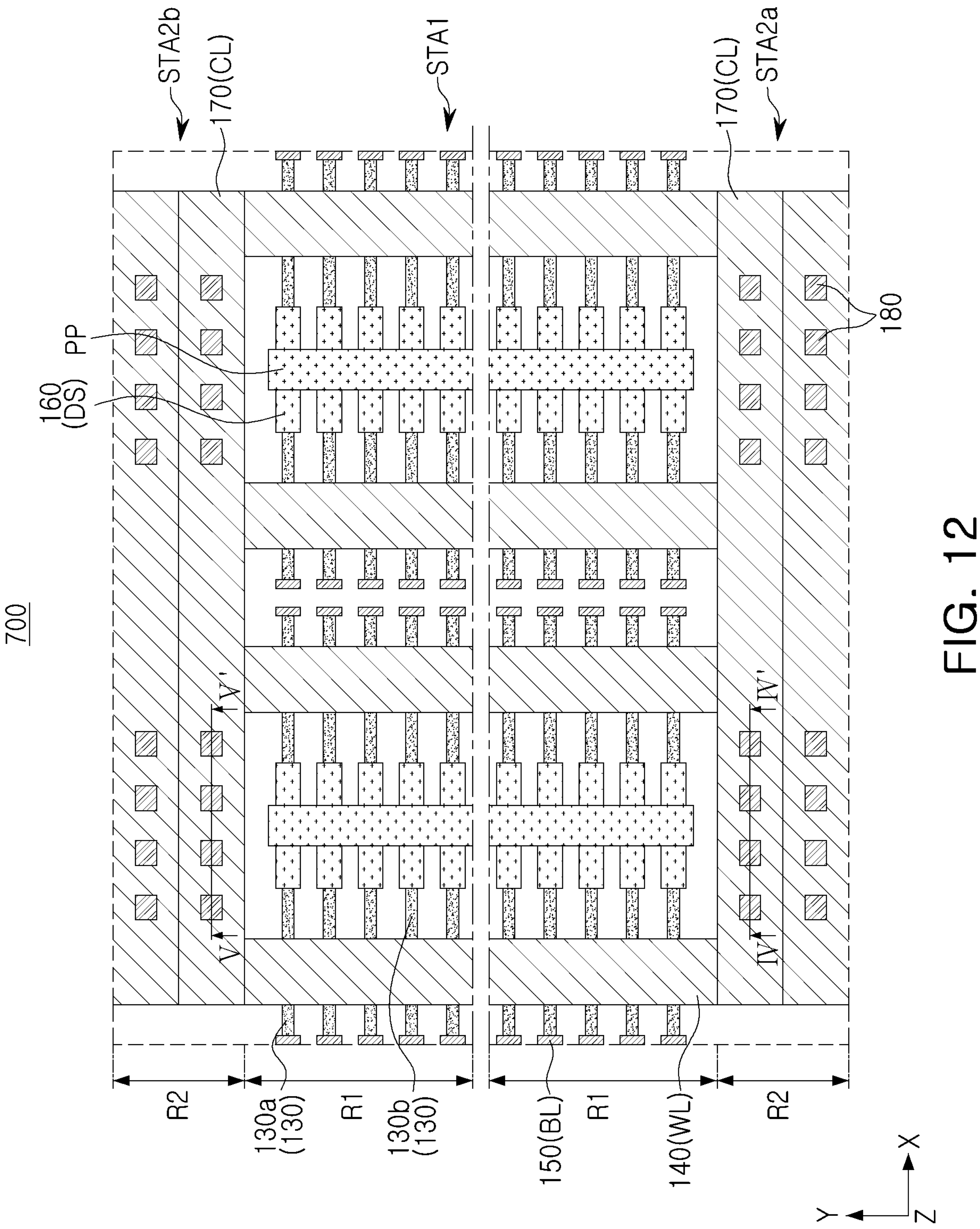
FIG. 12 is a schematic plan view illustrating a semiconductor device according to an example embodiment.
Figure 13:
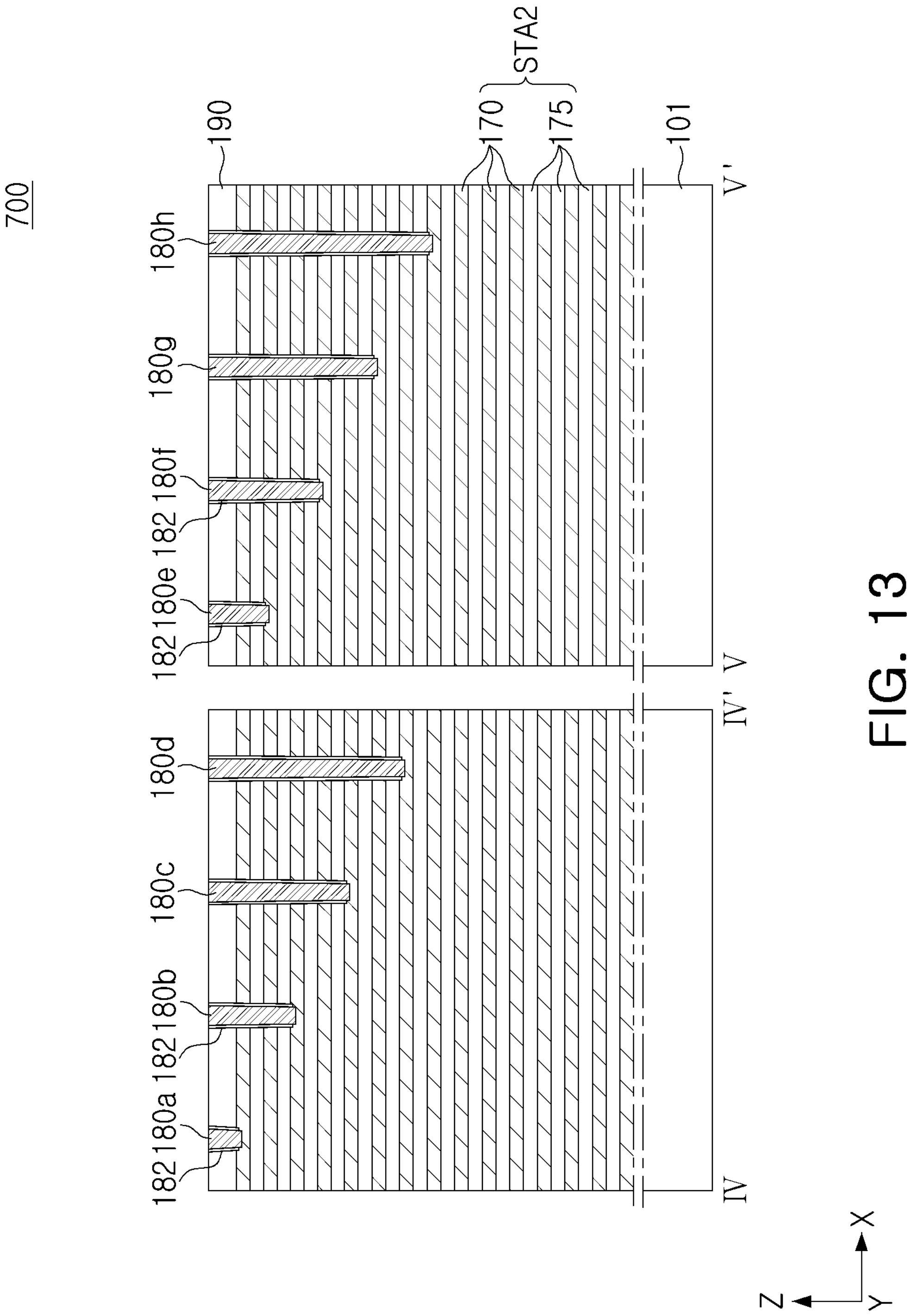
FIG. 13 is vertical cross-sectional views taken along lines IV-IV' and V-V' of the semiconductor device illustrated in FIG. 12.

FIG. 12 is a schematic plan view illustrating a semiconductor device according to an example embodiment. FIG. 13 is a vertical cross-sectional view taken along lines IV-IV' and V-V' of the semiconductor device illustrated in FIG. 12.

Referring to FIGS. 12 and 13, a semiconductor device 700 may include a stack structure STA1 disposed in a memory cell region R1, and a first connection structure STA2*a* and a second connection structure STA2*b* disposed in a contact region R2. The first connection structure STA2*a* and the second connection structure STA2*b* may be spaced apart from each other in the Y-direction with the stack structure STA1 therebetween, and may include connecting conductive lines 170.

The semiconductor device 700 may further include contact plugs 180 connected to the first connection structure STA2*a* and the second connection structure STA2*b*.

For example, the contact plugs 180 may include first to fourth contact plugs 180*a*, 180*b*, 180*c*, and 180*d* connected to the first connection structure STA2*a*, and may include fifth to eighth contact plugs 180*e*, 180*f*, 180*g*, and 180*h* connected to the second connection structure STA2*b*. A distance between lower surfaces of the first to fourth contact plugs 180*a*, 180*b*, 180*c*, and 180*d* in the Z-direction may be greater than a distance between adjacent connecting conductive lines 170. For example, the first to fourth contact plugs 180*a*, 180*b*, 180*c*, and 180*d* may be in contact with first, third, fifth, and seventh connecting conductive lines 170 from the top, respectively. A distance between lower surfaces of the fifth to eighth contact plugs 180*e*, 180*f*, 180*g*, and 180*h* in the Z-direction may be greater than a distance between lower surfaces of adjacent connecting conductive lines 170 in the Z-direction. For example, the fifth to eighth contact plugs 180*e*, 180*f*, 180*g*, and 180*h* may be in contact with second, fourth, sixth, and eighth connecting conductive lines 170 from the top, respectively.

FIGS. 14A to 14G are perspective views illustrating a method of manufacturing a connecting conductive line according to an example embodiment.

Figure 14A:
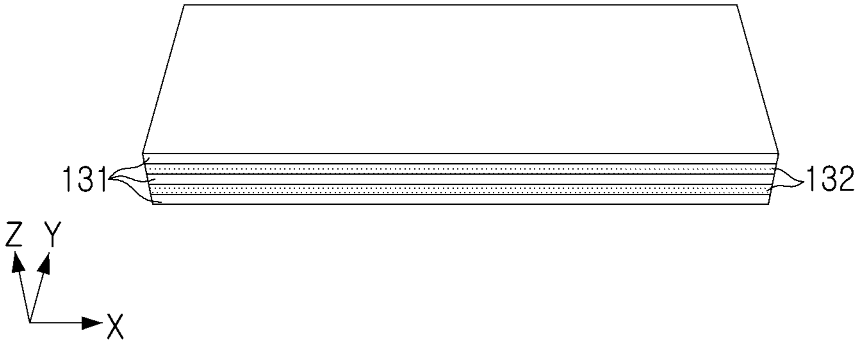
FIGS. 14A to 14G are perspective views illustrating a method of manufacturing a connecting conductive line according to an example embodiment.

Referring to FIG. 14A, a first material layer 131 and a second material layer 132 may be alternately stacked. The first material layer 131 and the second material layer 132 may be disposed on a memory cell region R1 and a contact region R2 illustrated in FIG. 2. The first material layer 131 may include a material having etch selectivity with respect to the second material layer 132.

In an example embodiment, the first material layer 131 may be formed of or include silicon, and the second material layer 132 may be formed of or include silicon-germanium, silicon oxide, silicon nitride, silicon carbide, silicon oxynitride, or a combination thereof. In an example embodiment, the first material layer 131 may be formed of or include silicon oxide, and the second material layer 132 may be formed of or include silicon nitride, silicon oxynitride, or a combination thereof.

Figure 14B:
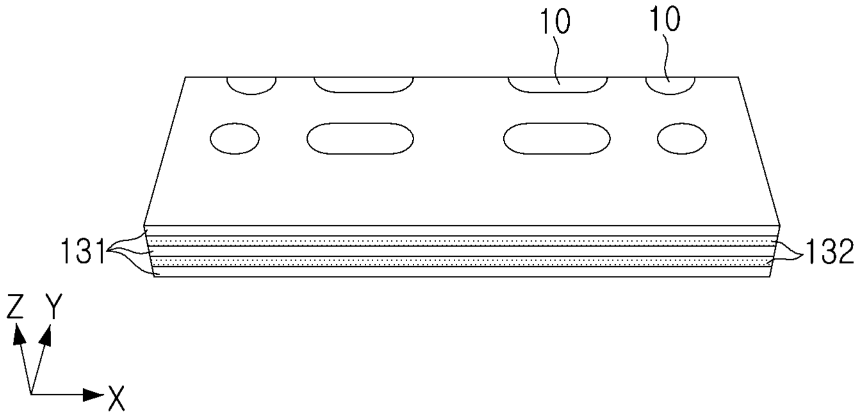

Referring to FIG. 14B, insulating pillars 10 extending in the Z-direction may be formed in the first material layer 131 and the second material layer 132. The insulating pillars 10 may be formed by anisotropically etching a stack of the first material layer 131 and the second material layer 132 and then filling the stack with an insulating material. The insulating pillars 10 may be disposed at positions between the active layers 130 illustrated in FIG. 2.

Figure 14C:
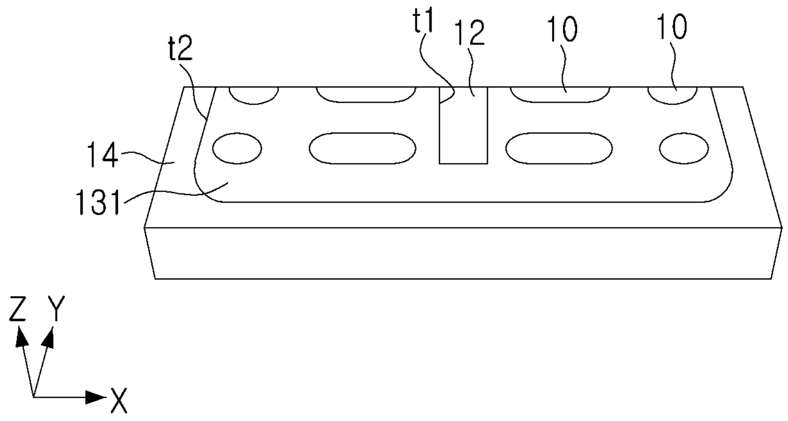

Referring to FIG. 14C, an insulating pillar 12 and an insulating layer 14 may be formed in a first trench t1 and a second trench t2, respectively. The first trench t1 may be formed by anisotropically etching a stack of the first material layer 131 and the second material layer 132, and the insulating pillar 12 may fill the first trench t1. The first trench t1 may extend in the Y-direction, and may be formed at a position in which the capacitor structure 160 illustrated in FIG. 2 will be disposed. The second trench t2 may extend in the Y-direction, and may be formed at a position in which the vertical conductive patterns 150 illustrated in FIG. 2 will be disposed. Furthermore, the stack of the first material layer 131 and the second material layer 132 may be removed from the contact region R2 except for a portion in which the connection structure STA2 illustrated in FIG. 2 will be disposed.

Figure 14D:
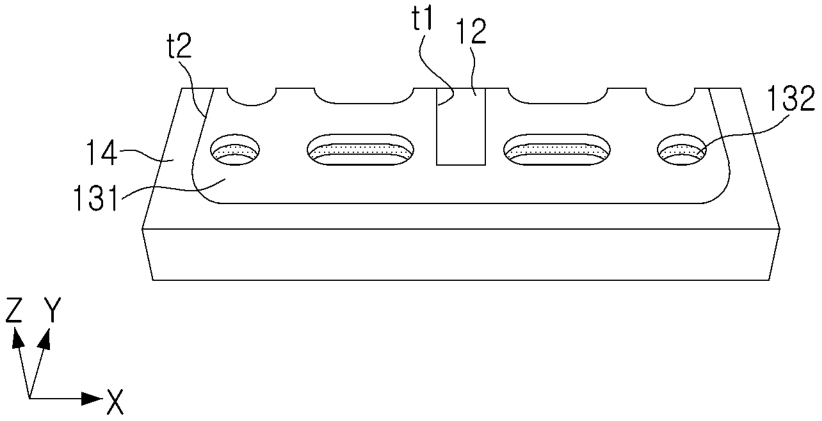

Referring to FIG. 14D, the insulating pillars 10 may be removed and side surfaces of the first and second material layers 131 and 132 may be exposed.

Figure 14E:
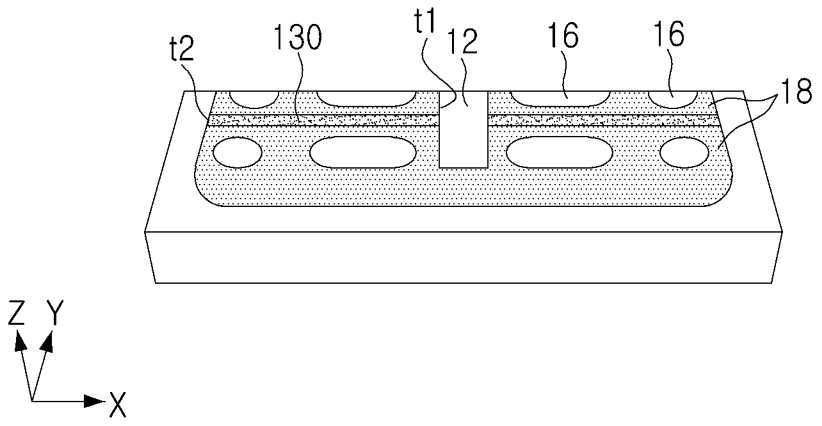

Referring to FIG. 14E, second material layers 132 may be removed, and an upper surface and a lower surface of the first material layers 131 covered with the second material layers 132 may be exposed. An etchant may be introduced through a space in which the insulating pillars 10 were disposed, and the first material layers 131 may be partially etched to form active layers 130. The active layers 130 may extend between the first trench t1 and the second trench t2 in the X-direction. The active layers 130 may include a structure and materials identical to or substantially the same as the active layers 130 described with reference to FIGS. 2 to 5.

After the active layers 130 are formed, insulating pillars 16 and insulating layers 18 may be formed by depositing an insulating material. The insulating pillars 16 may be formed in a space in which the insulating pillars 10 are disposed, and the insulating layers 18 may extend in the horizontal direction.

Figure 14F:
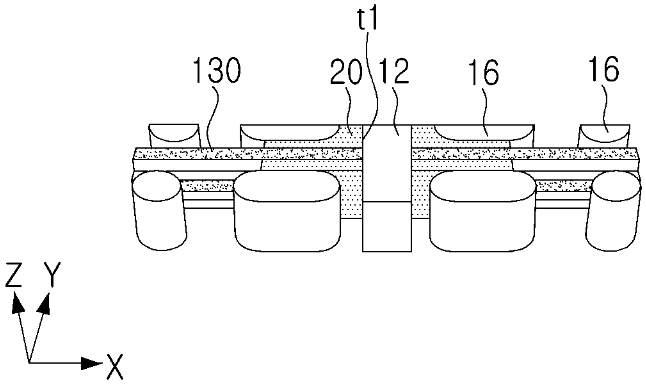

Referring to FIG. 14F, the insulating layer 14 may be removed, and the insulating pillars 16 and the active layers 130 may be exposed. After the insulating layer 14 is removed, an etchant may be introduced through the second trench t2, and the insulating layers 18 may be etched to form insulating layers 20. The insulating layers 20 may include a structure and materials identical to or substantially the same as the second insulating layers 122 described with reference to FIGS. 2 to 5.

Figure 14G:
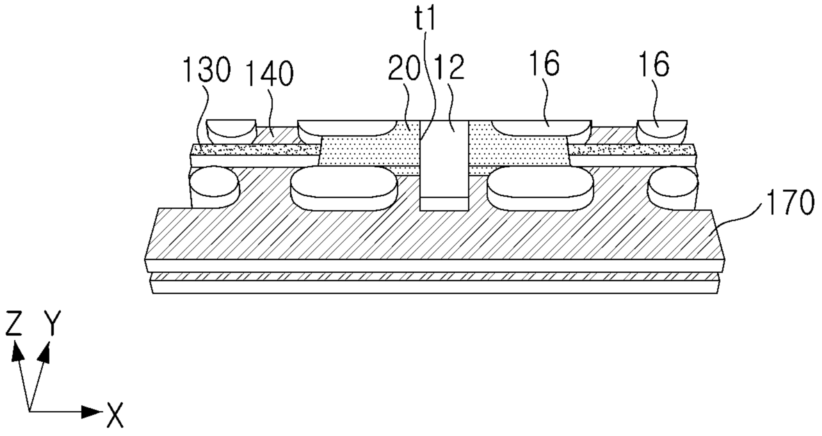

Referring to FIG. 14G, gate electrodes 140 and connecting conductive lines 170 may be formed by forming a conductive material between the active layers 130. The gate electrodes 140 and the connecting conductive lines 170 may include a structure and materials identical to or substantially the same as the gate electrodes 140 and the connecting conductive lines 170 described with reference to FIGS. 2 to 5. For example, the connecting conductive lines 170 may be in contact with the gate electrodes 140 spaced apart from each other in the X-direction.

In some example embodiments, the gate electrodes 140 and the connecting conductive lines 170 may be formed in different process steps.

FIGS. 15A to 15F are cross-sectional views illustrating a method of manufacturing a contact plug according to an example embodiment. FIGS. 15A to 15F may correspond to FIG. 6A.

Figure 15A:
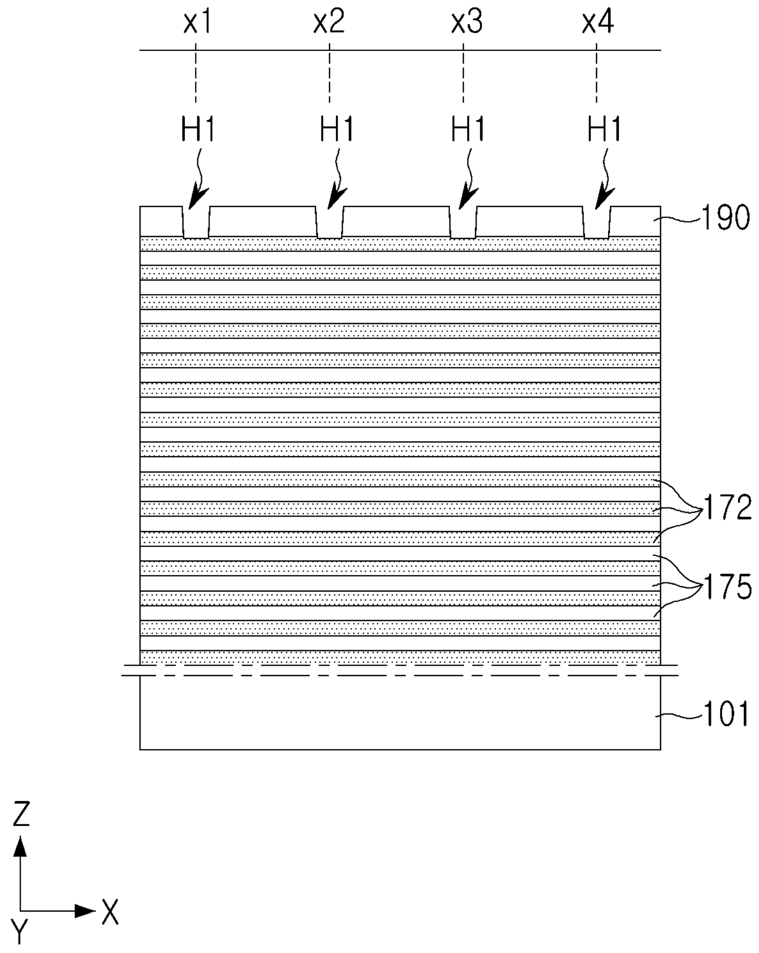
FIGS. 15A to 15F are cross-sectional views illustrating a method of manufacturing a contact plug according to an example embodiment.

Referring to FIG. 15A, sacrificial layers 172 and pad insulating layers 175 may be alternately stacked on a substrate 101. The sacrificial layers 172 and the pad insulating layers 175 may be disposed on a contact region R2 illustrated in FIG. 2. The sacrificial layers 172 may include a material having etch selectivity with respect to the pad insulating layers 175.

An interlayer insulating layer 190 may be formed on a stack of the sacrificial layers 172 and the pad insulating layers 175, and first contact holes H1 may be formed by anisotropic etching. The first contact holes H1 may be spaced apart from each other in the X-direction, and may be formed at the first to fourth positions (x1, x2, x3, and x4). The first to fourth positions (x1, x2, x3, and x4) may correspond to positions in which the contact plugs 180 illustrated in FIG. 6A will be formed. The first contact holes H1 may expose an upper surface of an uppermost sacrificial layer 172.

Figure 15B:
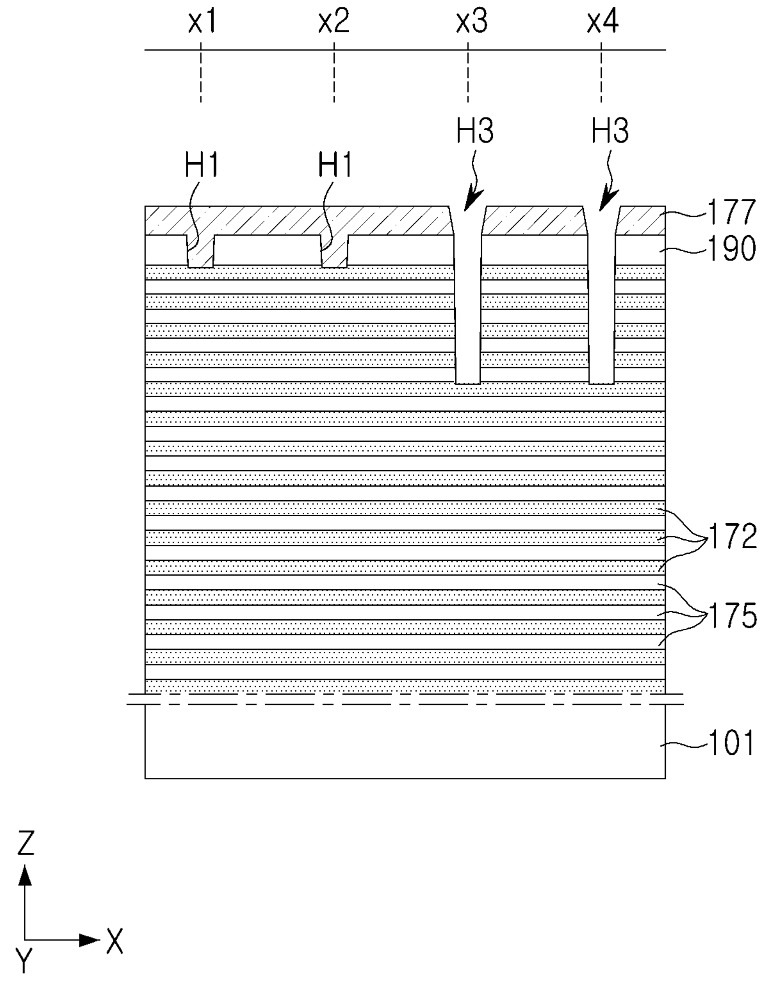

Referring to FIG. 15B, a mask layer 177 may be formed to cover the interlayer insulating layer 190 and fill the first contact holes H1. An anisotropic etching process may be performed using the mask layer 177 as an etch mask, and third contact holes H3 may be formed at a third position x3 and a fourth position x4. The third contact holes H3 may be formed to be deeper than the first contact holes H1 and may expose side surfaces of the sacrificial layers 172.

Figure 15C:
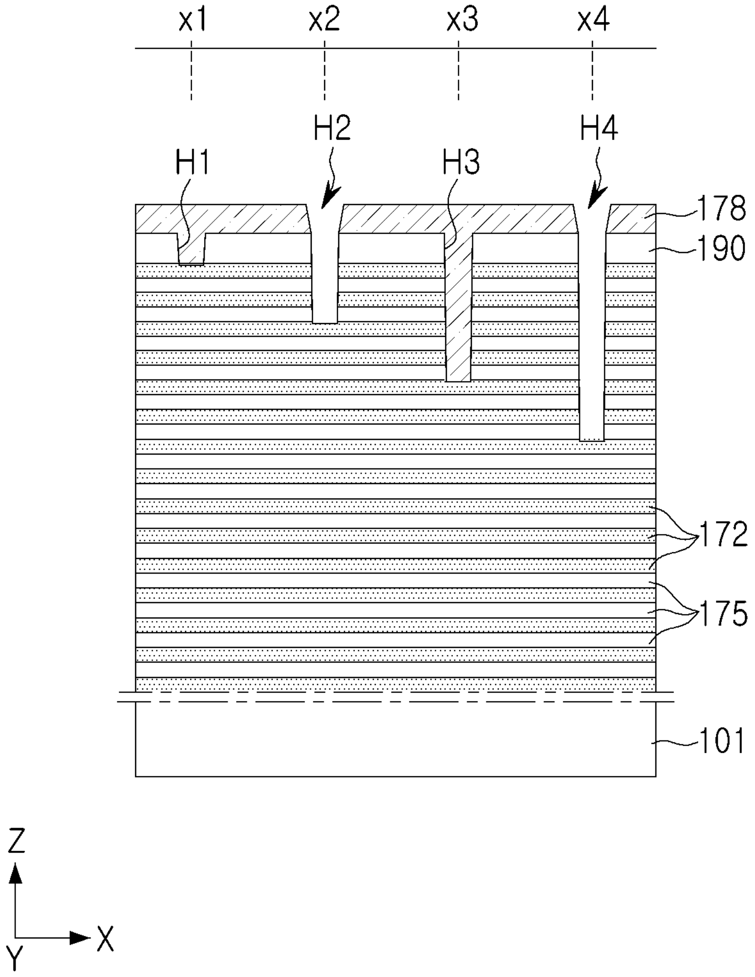

Referring to FIG. 15C, the mask layer 177 may be removed to expose the first contact holes H1 and the third contact holes H3. Then, a mask layer 178 may be formed to cover the interlayer insulating layer 190 and fill the first contact holes H1 and the third contact holes H3.

An anisotropic etching process may be performed using the mask layer 178 as an etch mask, and a second contact hole H2 and a fourth contact hole H4 may be formed at a second position x2 and a fourth position x4, respectively. The fourth contact hole H4 may be formed to be deeper than the third contact hole H3, and the second contact hole H2 may be formed to be shallower than the third contact hole H3.

Figure 15D:
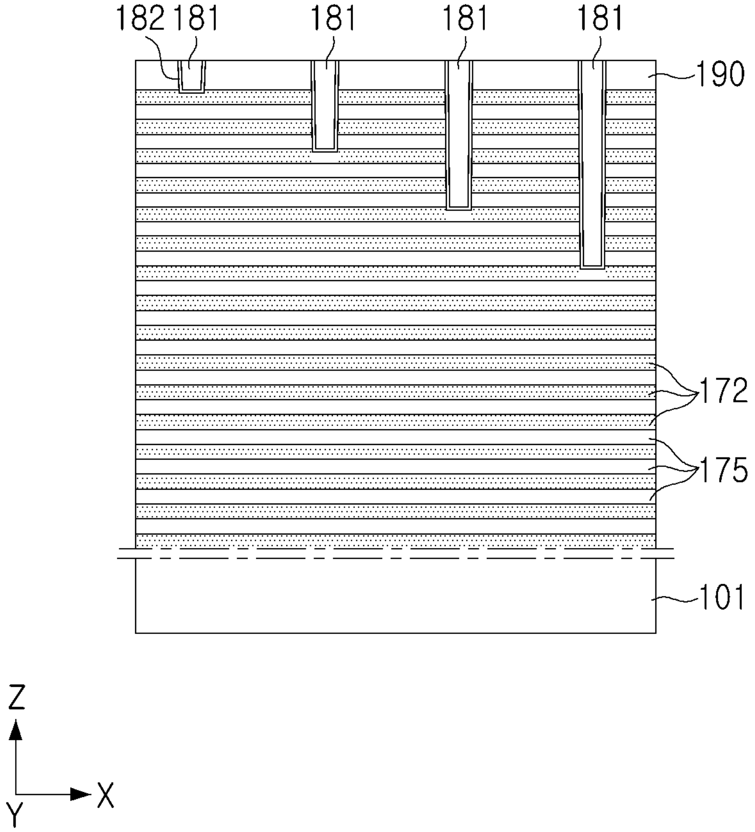

Referring to FIG. 15D, a plug insulating layer 182 and a filling layer 181 may be formed in the first to fourth contact holes H1, H2, H3, and H4. For example, the plug insulating layers 182 may be formed conformally along internal walls of the first to fourth contact holes H1, H2, H3, and H4, and filling layers 181 may be disposed on the plug insulating layers 182 and fill the first to fourth contact holes H1, H2, H3, and H4.

Figure 15E:
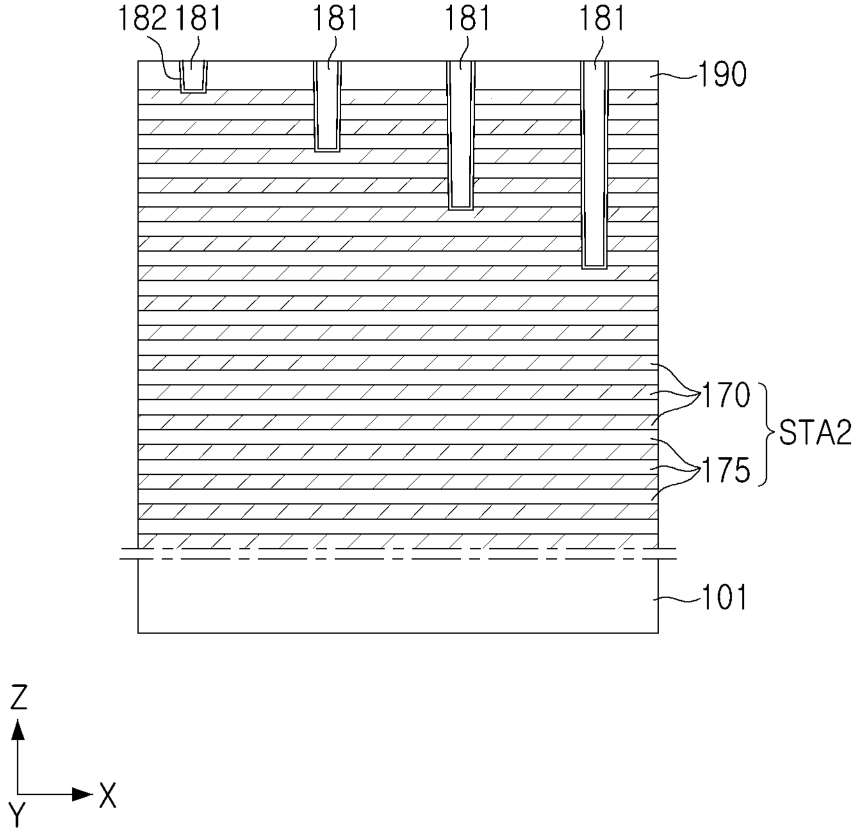

Referring to FIG. 15E, the sacrificial layers 172 may be removed, and connecting conductive lines 170 may be formed in a space in which the sacrificial layers 172 have been removed. The connecting conductive lines 170 and pad insulating layers 175 may form a connection structure STA2. During a process of removing the sacrificial layers 172, the plug insulating layers 182 and the filling layers 181 may not be removed.

Figure 15F:
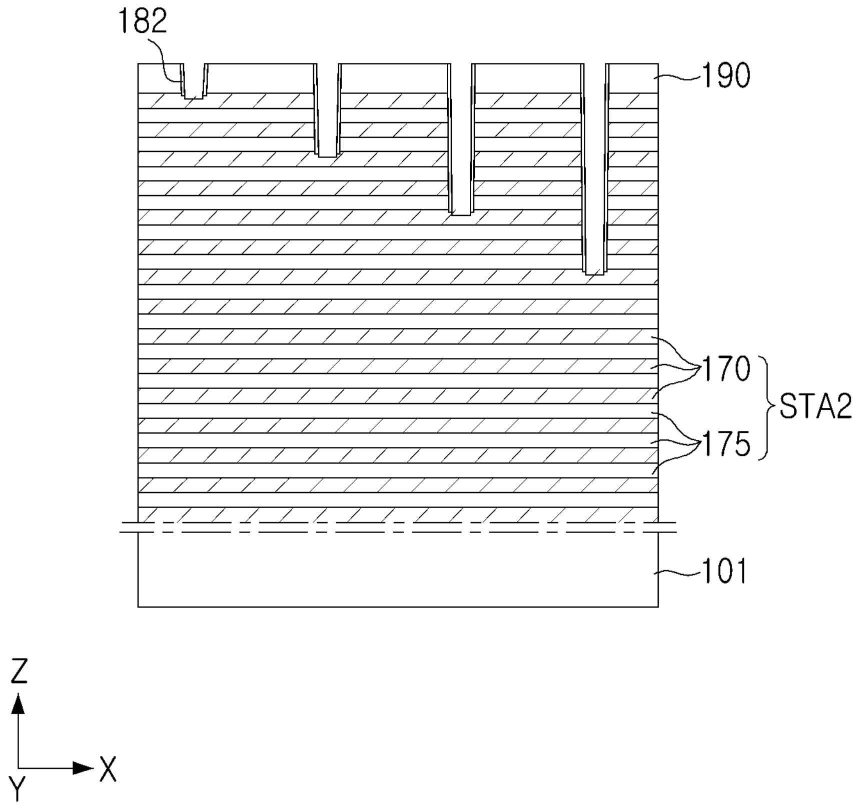

Referring to FIG. 15F, the filling layers 181 may be removed and the plug insulating layers 182 may be exposed. Then, an anisotropic etching process may be performed to partially remove lower ends of the plug insulating layers 182 and expose upper surfaces of the connecting conductive lines 170.

Referring again to FIG. 6A, contact plugs 180 may be formed by forming a conductive material in a space in which the filling layers 181 have been removed. The contact plugs 180 may extend in the Z-direction by penetrating through the connecting conductive lines 170. Because side surfaces of the contact plugs 180 may be covered with the plug insulating layers 182, each of the contact plugs 180 may be electrically connected to a corresponding connecting conductive line 170.

The present disclosure is not limited to the above-described embodiments and the accompanying drawings but is defined by the appended claims. Therefore, those of ordinary skill in the art may make various replacements, modifications, or changes without departing from the scope of the present disclosure defined by the appended claims, and these replacements, modifications, or changes should be construed as being included in the scope of the present disclosure.

What is claimed is:

1. A semiconductor device, comprising:

a substrate including a memory cell region and a contact region;

active layers extending in a first horizontal direction and stacked to be spaced apart from each other in a vertical direction on the memory cell region;

gate electrodes disposed between the active layers, extending in a second horizontal direction, that intersects the first horizontal direction, and stacked to be spaced apart from each other in the vertical direction;

connecting conductive lines disposed on the contact region, extending in the first horizontal direction, and stacked to be spaced apart from each other in the vertical direction; and vertical conductive patterns disposed on the memory cell region, extending in the vertical direction, and in contact with the active layers, wherein each of the connecting conductive lines contacts one gate electrode of the gate electrodes that are spaced apart from each other in the first horizontal direction and are disposed at the same level.

2. The semiconductor device of claim 1, further comprising:

contact plugs disposed on the contact region, extending in the vertical direction, and in contact with the connecting conductive lines.

3. The semiconductor device of claim 2, further comprising:

plug insulating layers covering side surfaces of the contact plugs.

4. The semiconductor device of claim 3, wherein a lower surface of each of the contact plugs is disposed at a lower level than a lower end of a corresponding plug insulating layer among the plug insulating layers.

5. The semiconductor device of claim 2, wherein at least one of the contact plugs vertically penetrates through one or more connecting conductive lines among the gate electrodes.

6. The semiconductor device of claim 2, wherein the contact plugs comprise a first contact plug and a second contact plug spaced apart from each other in the first horizontal direction, and wherein the first contact plug and the second contact plug vertically penetrate through the same connecting conductive line.

7. The semiconductor device of claim 1, wherein the connecting conductive lines comprise a first connecting conductive line having a first length in the second horizontal direction and a second connecting conductive line disposed on the first connecting conductive line and having a second length in the second horizontal direction, and wherein the first length is greater than the second length.

8. The semiconductor device of claim 1, wherein the connecting conductive lines comprise a first connecting conductive line having a first length in the first horizontal direction and a second connecting conductive line disposed on the first connecting conductive line and having a second length in the first horizontal direction, and wherein the first length is greater than the second length.

9. The semiconductor device of claim 1, further comprising:

select transistors disposed on the vertical conductive patterns; and select lines disposed adjacent to the select transistors on the vertical conductive patterns.

10. The semiconductor device of claim 9, further comprising:

a strapping line disposed on the select transistors, wherein one end of the select transistors is in contact with the vertical conductive patterns, and the other end of the select transistors is in contact with the strapping line.

11. The semiconductor device of claim 9, wherein the select transistors extend vertically and penetrate through the select lines.

12. The semiconductor device of claim 9, wherein the select lines are disposed on side surfaces of the select transistors.

13. A semiconductor device, comprising:

a substrate including a memory cell region and a contact region;

a stack structure disposed on the memory cell region, the stack structure including memory cell blocks spaced apart from each other in a first horizontal direction;

a connection structure including connecting conductive lines disposed on the contact region, extending in the first horizontal direction, and stacked to be spaced apart from each other in a vertical direction; and contact plugs penetrating through the connection structure in the vertical direction, wherein each of the memory cell blocks comprises:

active layers extending in the first horizontal direction and stacked to be spaced apart from each other in the vertical direction;

gate electrodes disposed between the active layers, extending in a second horizontal direction, that intersects the first horizontal direction, and stacked to be spaced apart from each other in the vertical direction; and vertical conductive patterns extending in the vertical direction and in contact with the active layers, and wherein each of the connecting conductive lines is in contact with one gate electrode of the gate electrodes of the memory cell blocks.

14. The semiconductor device of claim 13, wherein the memory cell blocks include a first memory cell block and a second memory cell block spaced apart from each other in the first horizontal direction, and wherein one of the connecting conductive lines is in contact with a first gate electrode of the first memory cell block and a second gate electrode of the second memory cell block.

15. The semiconductor device of claim 13, wherein the connection structure comprises a first connection structure and a second connection structure spaced apart from each other in the second horizontal direction with the stack structure interposed therebetween, and wherein the contact plugs comprise first contact plugs connected to the first connection structure and second contact plugs connected to the second connection structure.

16. The semiconductor device of claim 15, wherein a distance between lower surfaces of the first contact plugs is greater than a distance between lower surfaces of adjacent connecting conductive lines.

17. The semiconductor device of claim 13, wherein the connection structure has a stepped structure.

18. The semiconductor device of claim 17, wherein the connection structure is lowered in the first horizontal direction.

19. The semiconductor device of claim 17, wherein the connection structure is lowered in the second horizontal direction.

20. A semiconductor device, comprising:

a substrate including a memory cell region and a contact region;

a stack structure disposed on the memory cell region, the stack structure including memory cell blocks spaced apart from each other in a first horizontal direction;

a connection structure including connecting conductive lines disposed on the contact region, extending in the first horizontal direction, and stacked to be spaced apart from each other in a vertical direction; and contact plugs penetrating through the connection structure in the vertical direction, wherein each of the memory cell blocks comprises:

active layers extending in the first horizontal direction and stacked to be spaced apart from each other in the vertical direction, each active layer including a channel region and a first impurity region and a second impurity region spaced apart from each other in the first horizontal direction with the channel region interposed therebetween;

gate electrodes overlapping the channel regions of the active layers, extending in a second horizontal direction, that intersects the first horizontal direction, and stacked to be spaced apart from each other in the vertical direction;

vertical conductive patterns extending in the vertical direction and in contact with the first impurity regions of the active layers; and a capacitor structure in contact with the second impurity regions of the active layers, wherein each of the contact plugs is electrically connected to a corresponding gate electrode among the gate electrodes, and wherein each of the connecting conductive lines contacts one gate electrode of the gate electrodes that are spaced apart from each other in the first horizontal direction and are disposed at the same level.

* * * * *